(12) United States Patent
Yamada et al.

(10) Patent No.: US 6,215,462 B1
(45) Date of Patent: Apr. 10, 2001

(54) DISPLAY DEVICE AND DISPLAY DRIVING METHOD

(76) Inventors: Hiroyasu Yamada, 3-9-404, Bessho 2-chome, Hachioji-shi; Masaharu Shioya, 2276-1, Ninomiya, Akiruno-shi; Tomoyuki Shirasaki, 1425-2-5-101, Sakuragaoka 1-chome, Higashiyamato, Tokyo, all of (JP)

(*) Notice: Subject to any disclaimer, the term of this patent is extended or adjusted under 35 U.S.C. 154(b) by 0 days.

(21) Appl. No.: 09/144,689

(22) Filed: Sep. 1, 1998

(30) Foreign Application Priority Data

Sep. 5, 1997 (JP) .................................................. 9-256178

(51) Int. Cl.[7] ...................................................... G09G 3/30
(52) U.S. Cl. ............................................... 345/76; 345/81
(58) Field of Search .................................. 345/74, 76, 100, 345/80, 81, 84, 207; 315/169.1, 169.3

(56) References Cited

U.S. PATENT DOCUMENTS

| | | | | |
|---|---|---|---|---|
| 4,467,325 | * | 8/1984 | Lustig | 345/207 |
| 5,276,380 | * | 1/1994 | Tang | 313/504 |
| 5,461,400 | * | 10/1995 | Ishii et al. | 345/182 |
| 5,989,738 | * | 11/1999 | Haase et al. | 428/690 |

* cited by examiner

*Primary Examiner*—Xiao Wu

(57) ABSTRACT

An optical address section, a display section and light waveguides are provided on a substrate. The light waveguides are located between the optical address section and the display section. The optical address section includes first light emission elements, while the display section includes data electrodes, phototransistors and second light emission elements. The light emitted from the first light emission elements enters the phototransistors of the display section through the light waveguides and drives the phototransistors. In accordance with the phototransistors selected, the second light emission elements emit light upon application of a voltage of the data electrodes.

8 Claims, 15 Drawing Sheets

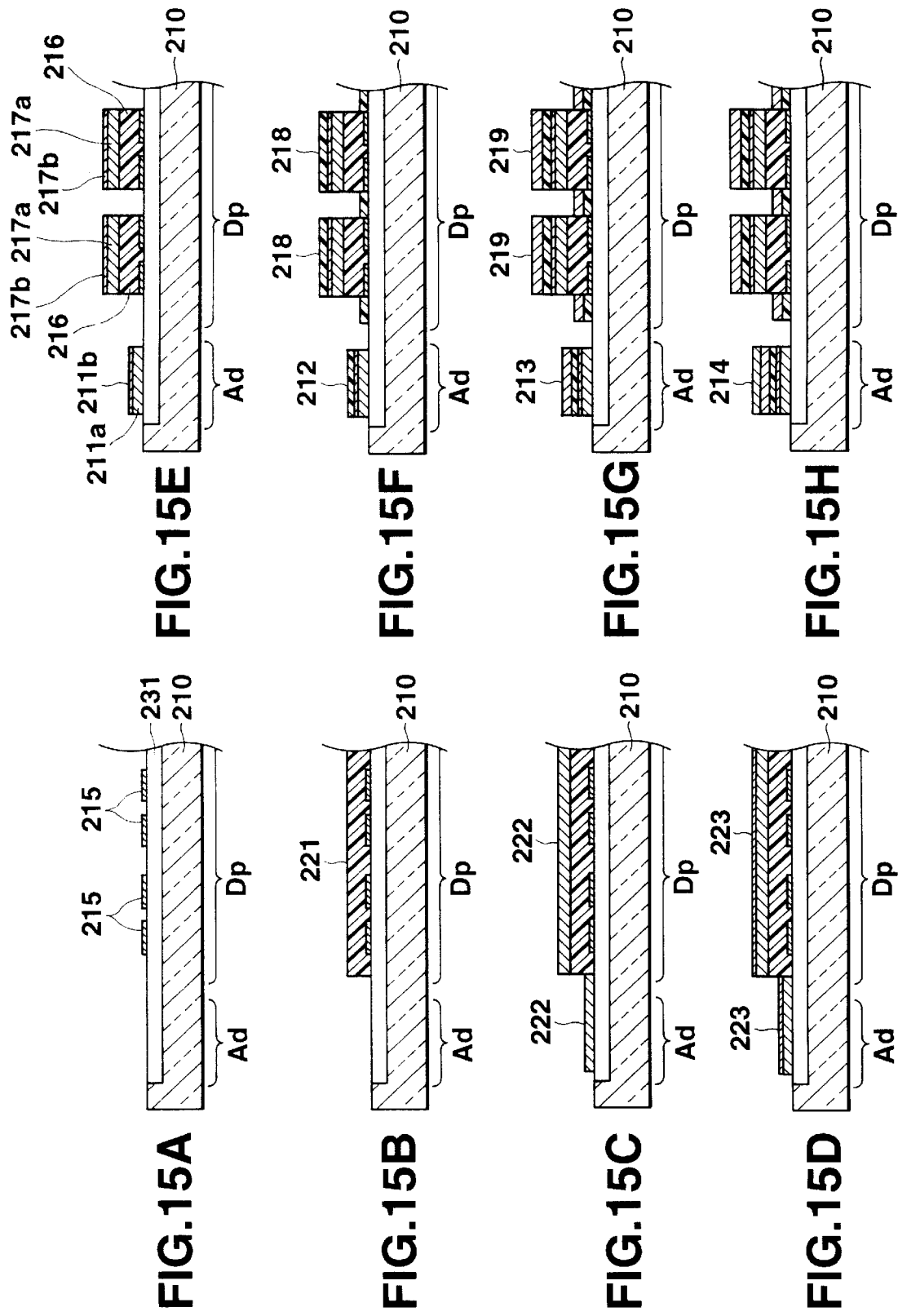

DISPLAY DEVICE AND DISPLAY DRIVING METHOD

BACKGROUND OF THE INVENTION

1. Field of the Invention

The present invention relates to a display device and a method for driving the same, and more particularly to a spontaneous light emission type display device with pixels having a high aperture ratio and a method for driving the display device.

2. Description of the Related Art

Of late, organic electroluminescent display devices have received attention as flat-panel electroluminescent display devices having a large viewing angle. Some organic electroluminescent dot-matrix display devices are active-matrix drive type, and others are simple-matrix drive type.

A conventional organic electroluminescent display device 350 is active-matrix drive type, and has organic electroluminescent elements 351, a plurality of drive transistors 352 for applying voltages to the electroluminescent elements 351, a plurality of capacitors 353 for retaining the applied voltages, and a plurality of selection transistors 354 for selectively writing image signals into the capacitors 353, as illustrated in FIG. 17 which is a diagram showing an equivalent circuit (corresponding to one pixel). The gates of the selection transistors 354 are connected to a gate driver via gate lines GL, while the drains of the selection transistors 354 are connected to a drain driver via drain lines DL.

When driving the organic electroluminescent elements 351, the selection transistors 354 are selected line by line in accordance with selection signals supplied from the gate driver. The drain driver writes image signals into the capacitors 353 in a currently selected line through the drain lines DL and the selection transistors 354. The drive transistors 352 drive the organic electroluminescent elements 351 in accordance with the magnitudes of the image signals written into the capacitors 353. Voltages according to gradations are applied to the organic electroluminescent elements 351, thereby making the display device display desired images. Thus, in the case of the organic electroluminescent display device 350, the selection transistors 354 are selected line by line, in which case there is no possibility of an unintended voltage being applied to the organic electroluminescent elements 351 in lines other than the currently selected line. This enables the display device to display images without the crosstalk occurring.

According to the organic electroluminescent display device 350 of the active-matrix drive type, however, the drive transistors 352, the capacitors 353 and the selection transistors 354 have to be formed in addition to the organic electroluminescent element 351 constituting each pixel. This entails a problem in that the area (aperture ratio) of the organic electroluminescent element 351 forming each pixel is small.

As shown in FIG. 18, an organic electroluminescent display device of the simple-matrix drive type includes a substrate 360, anode electrodes 361, an organic electroluminescent layer 362 and cathode electrodes 363, which are all laminated on the substrate 360. The anode electrodes 361 are perpendicular to the cathode electrodes 363. The intersections of the anode electrodes 361 and the cathode electrodes 363 are pixels. In the organic electroluminescent display device of the simple-matrix drive type, the aperture ratio of the pixels is higher than the aforementioned case.

According to the organic electroluminescent display device of the simple-matrix drive type, however, there is the possibility of a voltage being applied also to those parts of the organic electroluminescent layer 362 which are located on the anode electrodes 361 of the pixels in lines other than the currently selected line. Thus, when an unintended voltage is applied, crosstalk occurs due to the voltage-luminance characteristic of the organic electroluminescent layer 362, resulting in a low contrast ratio.

SUMMARY OF THE INVENTION

The present invention has been made in consideration of the above problems, and it is an object of the present invention to provide a display device, whose pixels have a high aperture ratio and which performs display with suppressed crosstalk, and a method for driving such a display device.

According to one aspect of the present invention having the aforementioned object, there is provided a display device comprising;

first light emission elements which emit light in a predetermined range of wavelengths when a predetermined voltage is applied to the first light emission elements;

light waveguides, each of which guides the light emitted from a corresponding one of the first light emission elements;

active elements, each having a first end and a second end and in each of which a carrier occurs upon incidence of the light emitted from a corresponding one of the first light emission elements and guided by a corresponding one of the light waveguides;

data electrodes to which a voltage is applied in accordance with image data, the first end of each of the active elements being connected to a corresponding one of the data electrodes; and second light emission elements which emit light in a predetermined wavelength range when currents flow in the second light emission elements, each of the second light emission elements being connected to the second end of a corresponding one of the active elements.

According to the above-described display device, when the first light emission elements are made to emit light, the light emitted therefrom enters the corresponding active elements through the light waveguides such that carriers occur in the active elements, rendering the resistance of the active elements low. While the first light emission elements are emitting no light, no carriers occur in the active elements, and consequently the resistance of the active elements remains high. When the resistance of the active elements is satisfactorily low, the voltage between each of the data electrodes and the second light emission elements is applied substantially to the second light emission elements. On the other hand, when the resistance of the active elements is satisfactorily high, the voltage between each of the data electrodes and the second light emission elements is applied substantially to the active elements. This eliminates the problem that due to the voltage applied to the data electrodes, an unintended voltage is applied to those ones of the second light emission elements which correspond to the non-selected first light emission elements which are emitting no light. The above-described display device can therefore display a high-quality image without crosstalk occurring.

Stacking the waveguides, the data electrodes, the active elements and the second light emission elements on the substrate in the described order ensures an improved aperture ratio to the second light emission elements.

According to another aspect of the present invention having the aforementioned object, there is provided a method for driving a display device including:

light waveguides which guide incident light, electroluminescent address elements formed on the light waveguides and from which light to be guided by the light waveguides is emitted in a predetermined range of wavelengths in accordance with an applied voltage, data electrodes provided on the light waveguides, and having light transmission parts which the address light passes through, a voltage being externally applied to the data electrodes in accordance with image data, active elements provided on the data electrodes, each of the active elements having a base in which a carrier occurs when the address light emitted from a corresponding one of the electroluminescent address elements enters the base, and electroluminescent display elements provided on the active elements, each of the electroluminescent display elements including an anode electrode, an organic electroluminescent layer and a cathode electrode, the method comprising steps of:

having the electroluminescent address elements sequentially emit the address light in order to selectively drive the active elements via the light waveguides; and making the electroluminescent display elements emit light by applying a voltage between each of the data electrodes and the anode electrodes or cathode electrodes of the electroluminescent display elements through the active elements which the address light guided by the light waveguides has entered.

The address light emitted from the electroluminescent address elements enters the corresponding active elements through the light waveguides. As a result, the resistance of the active elements becomes low, and the electroluminescent display elements emit light in accordance with the voltage applied between each of the data electrodes and the anode electrodes or cathode electrodes of the electroluminescent display elements. On the other hand, while the electroluminescent display elements are emitting no light, no carriers occur in the active elements such that the resistance of the active elements remains high. Under those conditions, there is no possibility of an unintended voltage being applied to the electroluminescent display elements. Therefore, according to the above-described driving method, the display device can display a high-quality image without crosstalk occurring, even in the case of a high-level time divisional drive.

BRIEF DESCRIPTION OF THE DRAWINGS

FIGS. 15A to FIG. 15H are diagrams showing the steps of manufacturing the organic electroluminescent panel;

DETAILED DESCRIPTION OF THE PREFERRED EMBODIMENT

An embodiment of the present invention will now be described with reference to the accompanying drawings.

An active-matrix display device according to one embodiment of the present invention will now be described exemplifying the case where it is applied to the display panel of a digital still camera.

Figure 1:
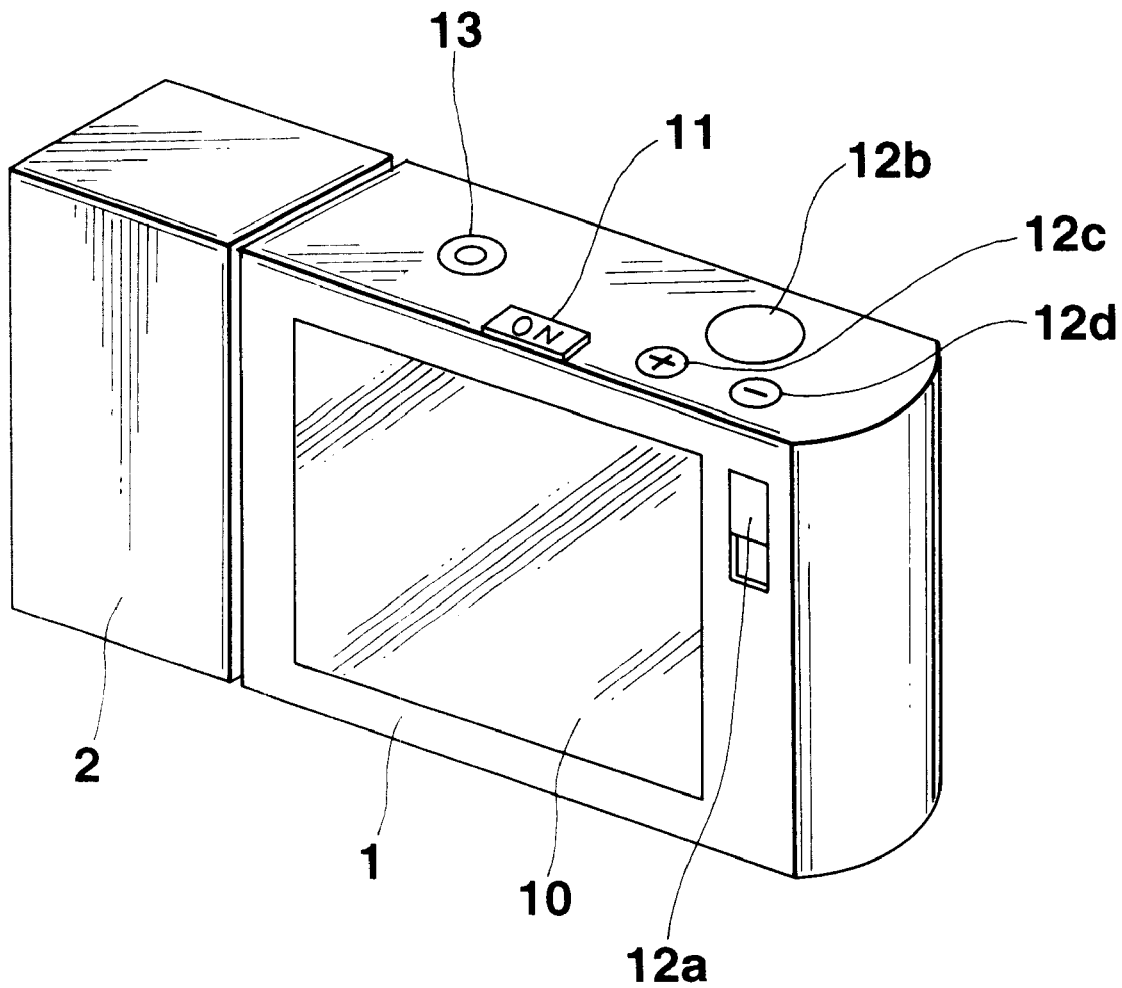
FIG. 1 is a diagram showing a perspective view of the digital still camera of the present invention.

FIG. 1 is a diagram illustrating a perspective view of the digital still camera of the present invention.

The illustrated digital still camera has a camera body 1 and a lens unit section 2.

The camera body 1 has a display section 10 and a mode setting key 12a on its front face. The mode setting key 12a is one for performing switching between a photographing mode in which an image is photographed and recorded in an image memory which will be described later, and a playback mode in which the recorded image is reproduced. The display section 10 serves as an organic electroluminescent display device. In the photographing mode, the display section 10 functions as a view finder (in a monitoring mode) for displaying an image viewed through a lens before the recording of the image. In the playback mode, the display section 10 functions as a display for displaying the image as recorded. The detailed structure of the display section 10 will be described later.

The camera body 1 has, on its upper face, an on/off key 11, a shutter key 12b, a "+" key 12c, a "−" key 12d and a serial input/output terminal 29.

The on/off key 11 is one for switching on/off the digital still camera upon the slide of the key 11.

The shutter key 12b is one for issuing an image recording instruction during the photographing mode and for confirming a choice during the playback mode. The "+" key 12c and the "−" key 12d are used to select, from the image data recorded in the image memory, the image data to be displayed on the display section 10 during the playback mode, and used also to determine a recording/reproducing condition. The serial input/output terminal 29 is one in which a cable for communications with an external apparatus (a personal computer, a printer or the like) is inserted.

The lens unit section 2 includes a lens for forming the image to be photographed. According to the illustration, the lens is located on the back side of the digital still camera. The lens unit section 2 is attached to the camera body 1 so as to be rotatable upward and downward through 360 degrees around a shaft coupled to the camera body 1.

Figure 2:
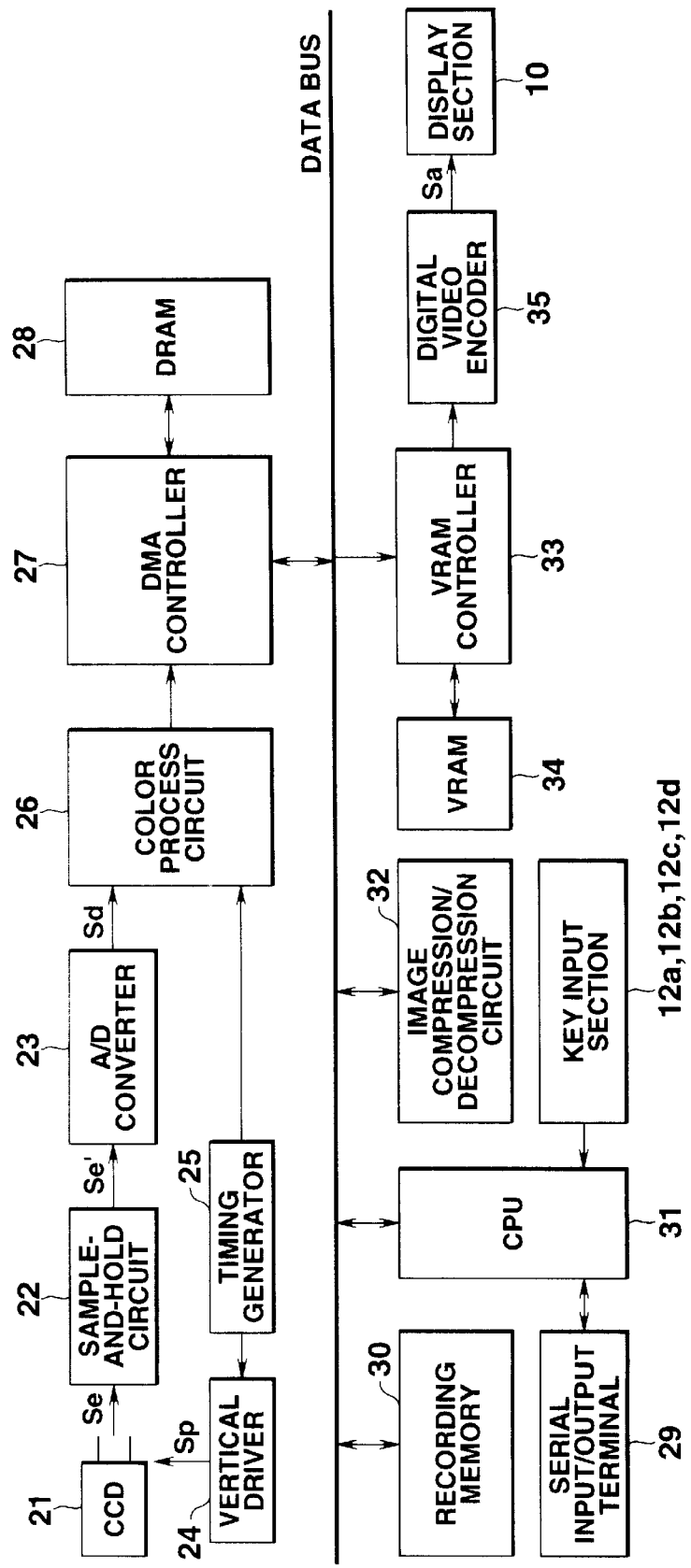
FIG. 2 is a block diagram showing the circuit structure of the digital still camera illustrated in FIG. 1.

FIG. 2 is a block diagram showing the circuit structure of the digital still camera illustrated in FIG. 1.

As seen from FIG. 2, the circuitry of the digital still camera includes: the display section 10; a key input section with the keys 12a, 12b, 12c and 12d; a CCD (Charge Coupled Device) 21 having a plurality of photographing pixels which are arranged in matrix form and in which electric charges are accumulated in accordance with the intensity of received light; a sample-and-hold circuit 22; an A/D converter 23; a vertical driver 24; a timing generator 25; a color process circuit 26; a DMA controller 27; a DRAM 28; a recording memory 30; a CPU (Central Processing Unit) 31 for executing stored programs in accordance with commands supplied from the key input section with the keys 12a, 12b, 12c and 12d and for controlling the individual parts of the circuitry of the digital still camera; an image compression/decompression circuit 32; a VRAM controller 33; a VRAM 34; a digital video encoder 35; and the serial input/output terminal 29.

Explanations will now be made as to how the above-described circuitry operates during the photographing mode. The photographing mode includes two operation modes. One is the monitoring mode of displaying the object to be photographed on the display section 10, and the other is the image recording mode of recording the photographed image as image data.

In the monitoring mode, the CPU 31 drives the CCD 21, while controlling the timing generator 25 and the color process circuit 26 every preset photographing cycle. In response to a drive signal Sp output from the vertical driver 24, the CCD 21 sequentially outputs to the sample-andhold circuit 22 an electric signal Se which has been converted in accordance with the luminosity of the photographed image. The sample-and-hold circuit 22 outputs the effective part Se' of the electric signal Se to the A/D converter 23. The A/D converter 23 converts the effective part Se' to digital data Sd, and outputs the digital data Sd to the color process circuit 26. The color process circuit 26 outputs YUV data, i.e., luminance/chrominance digital data to the DMA controller 27 in accordance with the digital data Sd. The DMA controller 27 records/updates the YUV data in the DRAM 28.

The CPU 31 reads out, from the DRAM 28, 1-frame YUV data transferred from the DMA controller 27, and writes the readout data in the VRAM 34. The digital video encoder 35 reads out the 1-frame YUV data every predetermined cycle from the VRAM 34 via the VRAM controller 33 in linear sequence, generates an analog video signal Sa and outputs the signal Sa to the display section 10.

The serial input/output terminal 29 is an input/output terminal used when the CPU 31 performs a serial transfer of data to an external unit.

The key input section includes the mode setting key 12a, the shutter key 12b, the "+" key 12c and the "−" key 12d, all being provided on the camera body 1. The key input section outputs the commands corresponding to those keys to the CPU 31.

The image recording mode will now be described.

When a user depresses the shutter key 12b while the CCD 21 is outputting the electric signal Se to the sample-and-hold circuit 22, the CPU 31 controls the timing generator 25 and the color process circuit 26 in order to stop a transferring operation. The electric signal Se, which corresponds to the 1-frame image transferred latest, is converted to YUV data via the sample-and-hold circuit 22, the A/D converter 23 and the color process circuit 26, as in the case of the monitoring mode. The CPU 31 makes the DMA controller 27 read the YUV data in a predetermined format and input the YUV data to the image compression/decompression circuit 32. The image compression/decompression circuit 32 compresses the YUV data. The compressed YUV data is stored in the recording memory 30. After the storing operation is finished, the CPU 31 restarts the timing generator 25 and the color process circuit 26, and automatically returns to the monitoring mode.

In the playback mode, the image compression/decompression circuit 32 decompresses the data stored in the recording memory 30, in accordance with the operations of the keys 12a, 12b, 12c and 12d of the key input section. The 1-frame YUV data as decompressed is read out from the image compression/decompression circuit 32, and is written in the VRAM 34 via the VRAM controller 33. The video encoder 35 reads out the 1-frame YUV data from the VRAM 34 in linear sequence, converts the YUV data to the analog video signal Sa, and outputs the signal Sa to the display section 10. The display section 10 switches over from the monitoring mode to the mode of displaying the recorded image. The display section 10 can be set so as to switch over from the image recording mode to the playback mode immediately after the image recording is finished and display the recorded 1-frame image without any operation of the keys 12a, 12b, 12c and 12d of the key input section.

Figure 3:
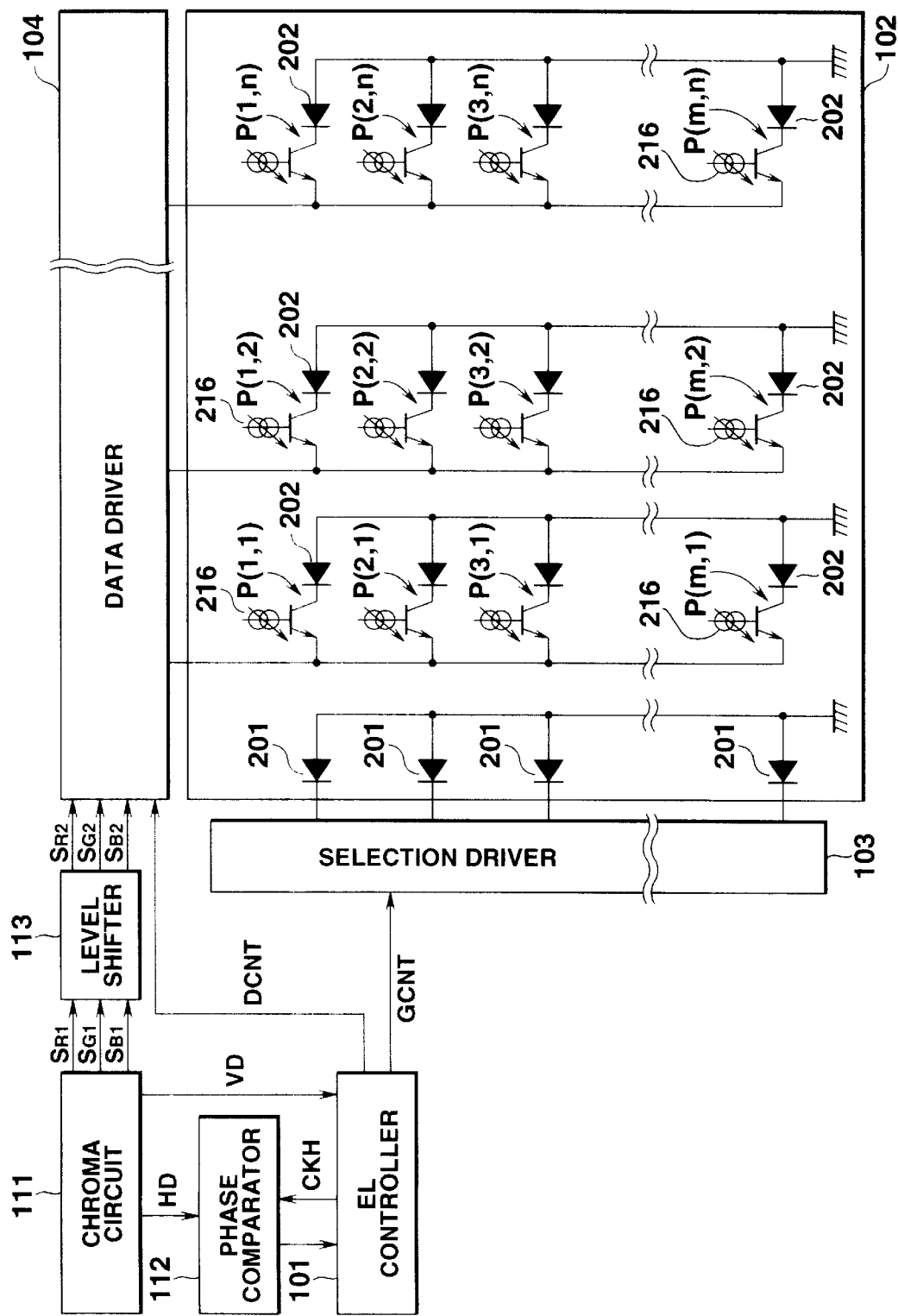
FIG. 3 is a block diagram showing the structure of the display section illustrated in FIGS. 1 and 2.

FIG. 3 is a block diagram showing the structure of the display section 10 illustrated in FIGS. 1 and 2.

The display section 10, which serves as the organic electroluminescent display device, includes a chroma circuit 111, a phase comparator 112, an EL controller 101, an electroluminescent panel 102, a selection driver 103 and a data driver 104.

In both the monitoring mode and the image recording mode, the chroma circuit 111 generates analog RGB signals $S_{R1}$, $S_{G1}$ and $S_{B1}$, based on the analog video signal Sa output from the digital video encoder 35. The RGB signals $S_{R1}$, $S_{G1}$ and $S_{B1}$ are those which has undergone a gamma control according to the visual characteristic of the electroluminescent panel 102. In order to adjust the luminance, the level shifter 113 controls the amplitudes of the analog RGB signals $S_{R1}$, $S_{G1}$ and $S_{B1}$ generated by the chroma circuit 111, and outputs level-shifted analog RGB signals $S_{R2}$, $S_{G2}$ and $S_{B2}$ as a result. The EL controller 101, which includes an oscillation circuit, establishes vertical synchronization in accordance with an input vertical sync signal VD which the chroma circuit 111 has separated from the analog video signal Sa, and outputs a phase comparison signal CKH. The phase comparator 112 compares the phase of the phase comparison signal CKH and that of a horizontal sync signal HD extracted from the analog video signal Sa with each other, and generates a phase comparison output. In accordance with the phase comparison output, the EL controller 101 forms a PLL (Phase Locked Loop) to establish horizontal synchronization, and outputs a control signal group DCNT and a control signal group GCNT to the data driver 104 and the selection driver 103, respectively.

The electroluminescent panel 102 includes an m×n matrix of pixels P(1, 1) to P(m, n), arranged in rows of m and columns of n, and a plurality of electroluminescent address elements 201 arranged in a column (the direction in which the rows extend will be hereinafter referred to as the row direction, while the direction in which the columns extend will be hereinafter referred to as the column direction). The electroluminescent panel 102 performs display by way of causing the pixels selected by the active-matrix drive to emit light. Each pixel P includes a set of elements, i.e., an electroluminescent display element 202 and a phototransistor 216. The electroluminescent display element 202 of each pixel P emits light due to an exciton resulting from the recombination of a hole and an electron.

The phototransistor 216 of each pixel P is an NPN-type transistor whose emitter is connected to the data driver 104 and whose collector is connected to the cathode of the corresponding electroluminescent display element 202. When light in a predetermined range of wavelengths enters the base of the phototransistor 216, a current flows between the emitter and the collector in accordance with the voltage applied by the data driver 104. The anode of each electroluminescent display element 202 is connected to the ground.

The selection driver 103, which includes a shift register having an n-stage structure, sequentially selects the electroluminescent address elements 201 of the electroluminescent panel 102, and makes the electroluminescent address elements 201 emit light in accordance with signals Φ1, Φ2, a clock signal CK1, an inverted clock signal¬CK1("¬" represents logical NOT) and a start signal IN, all being included in the control signal group GCNT.

The data driver 104 is connected to the phototransistors 216 arranged in columns, and applies/supplies a voltage/current having a predetermined value to them.

The electroluminescent address elements 201, whose cathodes are connected to the selection driver 103 and whose anodes are connected to the ground, sequentially emit light in such a wavelength range as to turn on the phototransistors 216, in accordance with signals supplied from the selection driver 103.

Figure 4:
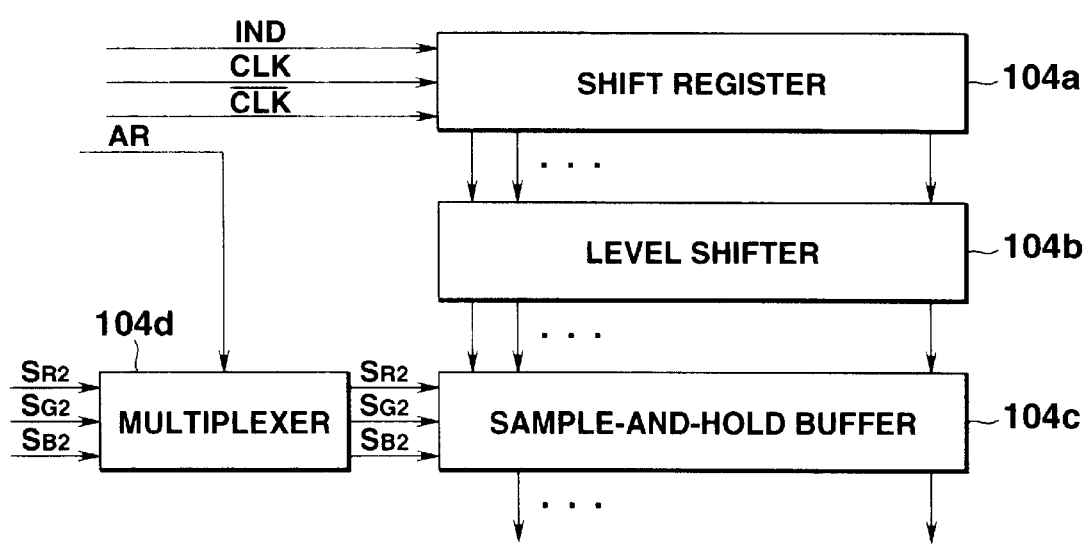
FIG. 4 is a block diagram showing the structure of the data driver illustrated in FIG. 3.

As illustrated in FIG. 4, the data driver 104 includes a shift register 104a, a level shifter 104b, a sample-and-hold buffer 104c and a multiplexer 104d.

The shift register 104a has an n-stage structure corresponding to the number of pixels arranged horizontally in the electroluminescent panel 102. Of the control signal group $DCNT_7$ a clock signal CLK, an inverted clock signal¬CLK and a start signal IND are input to the shift register 104a, as a result of which the shift register 104a generates a sampling signal for the sampling of the analog RGB signals. The level shifter 104b is a circuit for converting the sampling signal to one at the operation level of the sample-and-hold buffer 104. Based on the arrangement signal AR included in the control signal group DCNT, the multiplexer 104d outputs the analog video signals $S_{R2}$, $S_{G2}$ and $S_{B2}$ after arranging them in sequence according to the arrangement of RGB to be represented by pixels in each line. Based on the sampling signal supplied from the level shifter 104b, the sample-and-hold buffer 104c amplifies the analog video signals $S_{R2}$, $SG_2$ and $S_{B2}$ by means of buffers and outputs them to drain lines DL1 to DLm.

The organic electroluminescent panel 102 is a spontaneous light emission display which displays an image in an m×n dot-matrix pattern by employing the optical address drive which utilizes the light emitted from the electroluminescent address elements 201.

Figure 5:
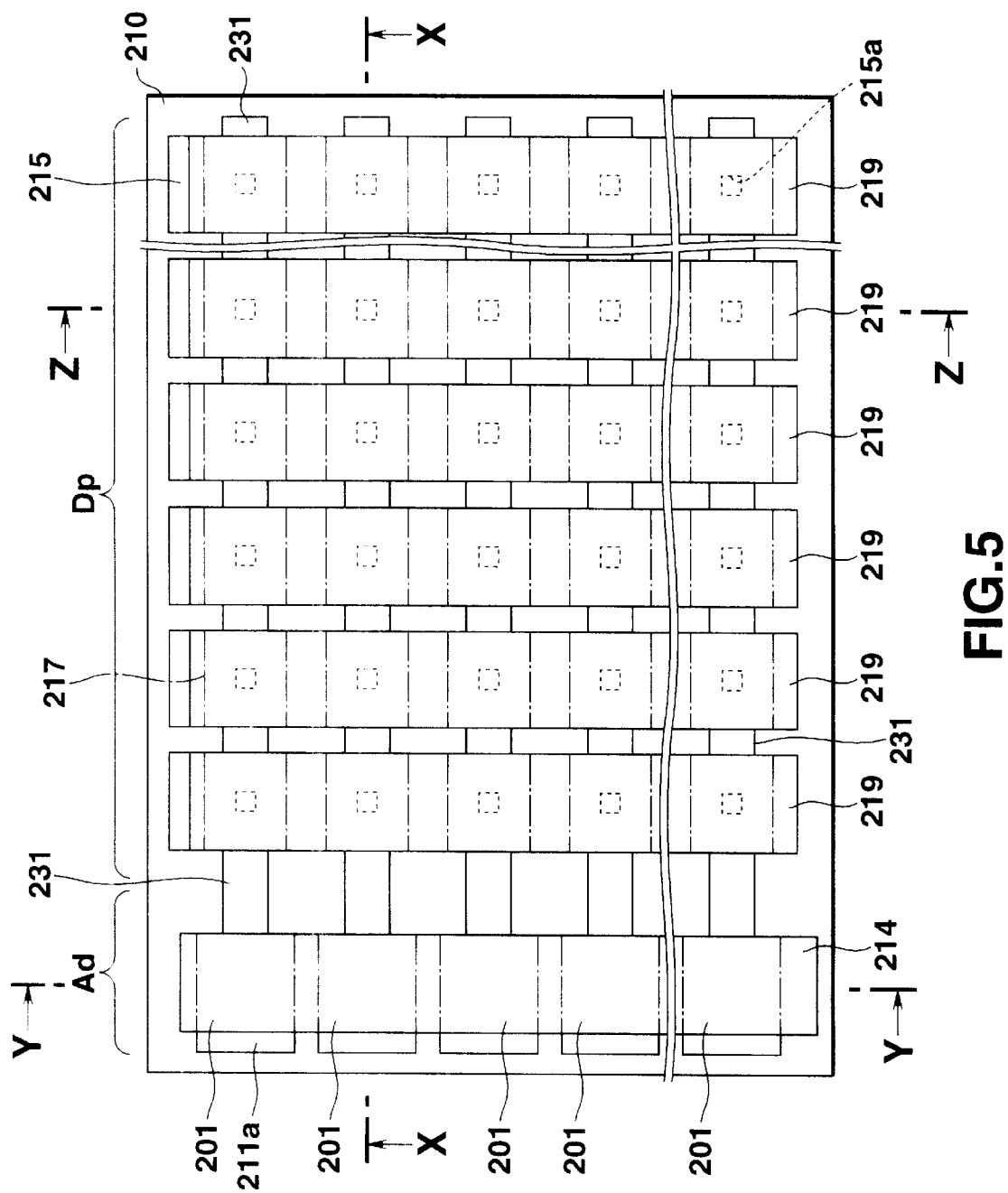
FIG. 5 is a diagram showing a plan view of the organic electroluminescent panel used in the display section illustrated in FIG. 1.
Figure 6:
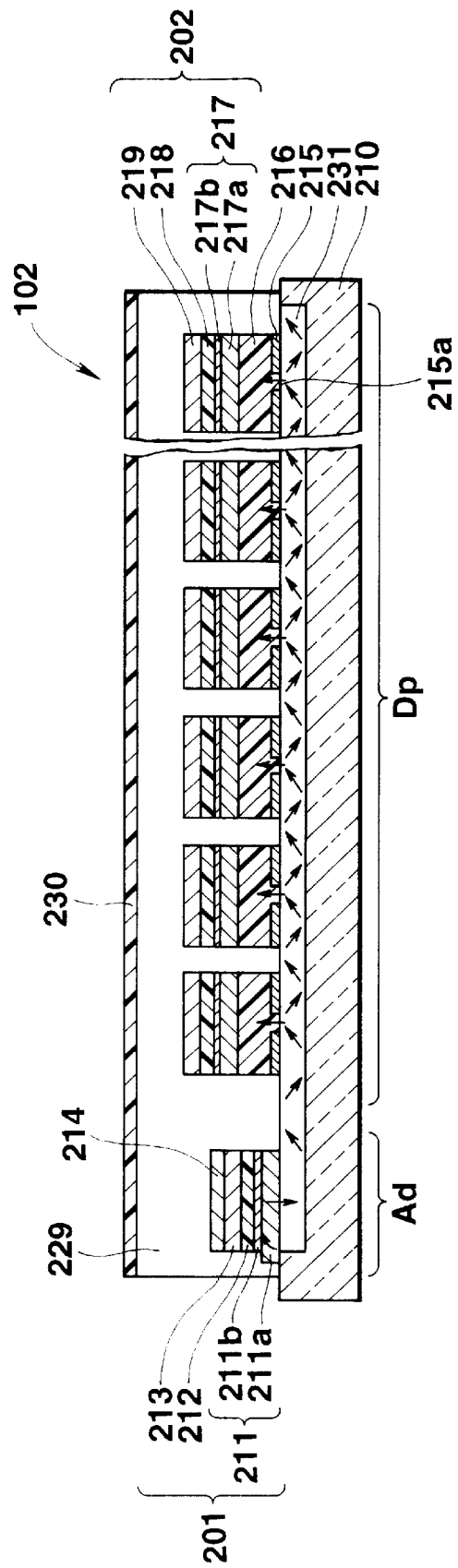
FIG. 6 is a diagram illustrating a cross section taken along the line X—X shown in FIG. 5.
Figure 7:
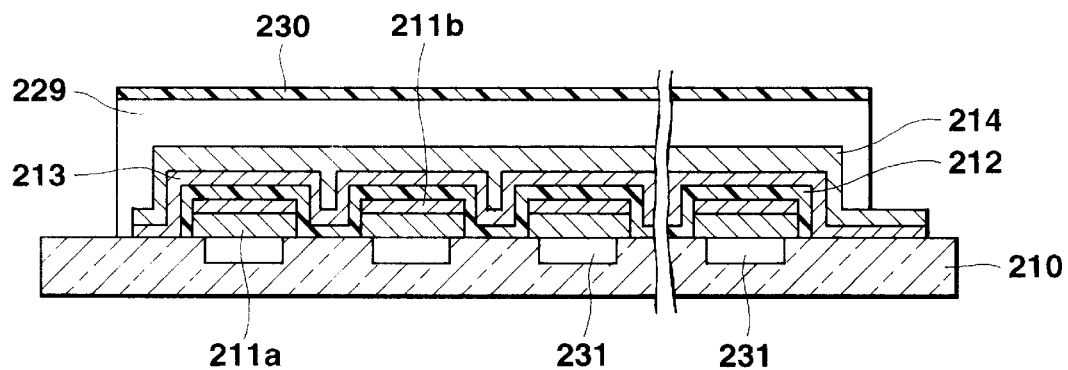
FIG. 7 is a diagram illustrating a cross section taken along the line Y—Y shown in FIG. 5.
Figure 8:
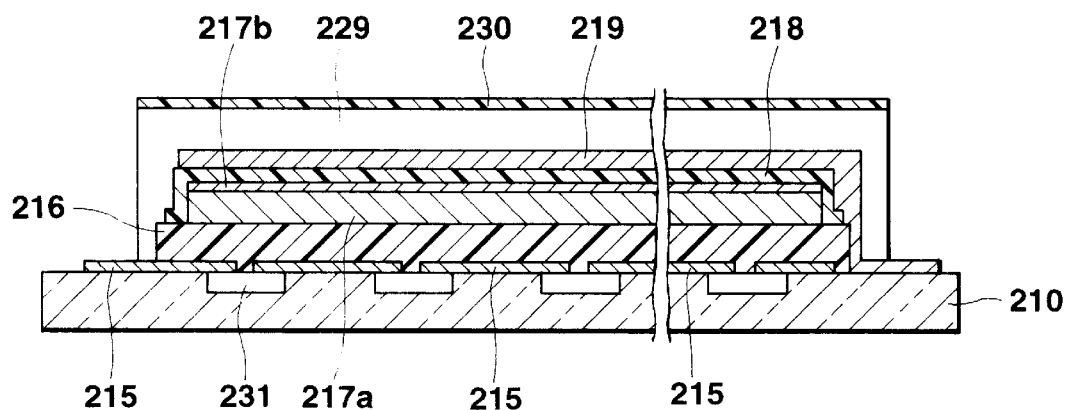
FIG. 8 is a diagram illustrating a cross section taking along the line Z—Z shown in FIG. 5.

FIG. 5 is a diagram illustrating a plan view of the organic electroluminescent panel 102. FIG. 6 is a diagram illustrating a sectional view taken along the line X—X shown in FIG. 5. FIG. 7 is a diagram illustrating a sectional view taken along the line Y—Y shown in FIG. 5. FIG. 8 is a diagram illustrating a sectional view taken along the line Z—Z shown in FIG. 5.

As illustrated in the above-mentioned drawings, the organic electroluminescent panel 102 has an optical address section Ad in which the electroluminescent address elements 201 are arranged, and a display section Dp in which the electroluminescent display elements 202 are arranged. The substrate 210 of the organic electroluminescent panel 102 is made of transparent quarts glass or resin, and is provided with a plurality of light waveguides 231 arranged so as to extend parallel with each other in the row direction. The light waveguides 231 are formed by diffusing an impurity, such as Pb or the like, into the glass substrate. The light waveguides 231 have a refractive index greater than that of those parts of the substrate 210 into which the impurity has not been diffused, and guide the light emitted from the electroluminescent address elements 201 in the optical address section Ad to the display section Dp, with the light being reflected at the interface between the substrate 210 and the light waveguides 231.

The electroluminescent address elements 201 are arranged on that part of the substrate 210 which is located in the optical address section Ad. A reflector 214 for the light waveguides 231 is arranged so as to extend in the column direction on the electroluminescent address elements 201. The electroluminescent address elements 201 include m cathode electrodes 211 arranged in a column on the substrate 210, a continuous organic electroluminescent layer 212 extending in the column direction on the cathode electrodes 211, and an anode electrode 213 extending in the column direction on the organic electroluminescent layer 212.

Each cathode electrode 211 includes a transparent electrode layer 211a and a metal thin film 211b. The transparent electrode layer 211a is made of ITO (Indium Tin Oxide), $In_2O_3(ZnO)_m$ (m>0) or the like, and exhibits the property of transmitting visible light. The metal thin film 211b contains at least one of low work function metals such as Mg, MgAg, MgIn, etc. and low-resistance metals such as Al, Cr, etc., in order to facilitate the injection of electrons into the electron transporting luminescent layer (described later) included in the organic electroluminescent layer 212. The metal thin film 211b is formed as thin as 0.5 nm to 3 nm so that it can efficiently transmit the light emitted from the organic electroluminescent layer 212. The selection driver 103 supplies selection signals to the cathode electrodes 211. The organic electroluminescent layer 212 has a two-layer structure including an electron transporting luminescent layer which faces the cathode electrodes 211 and a hole transporting layer which faces the anode electrode 213.

The electron transporting luminescent layer is made of beryllium-bis(10-hydroxybenzo[h]quinolinate) (which will be hereinafter referred to as Bebq2).

The hole transporting layer is made of N,N'-di(α-naphthyl)-N,N'-diphenyl-1,1'-biphenyl-4,4'-diamine (which will be hereinafter referred to as α-NPD). When a voltage is applied between electrodes, a current flows therebetween such that a hole and an electron recombine with each other, causing an exciton. The electron transporting luminescent layer absorbs the exciton and the organic electroluminescent layer 212 emits light accordingly. Due to the use of Bebq2 as the material of the electron transporting luminescent layer, the electroluminescent address elements 201 emit green light.

The anode electrode 213 is a transparent electrode formed by using ITO (Indium Tin Oxide), $In_2O_3$ $(ZnO)_m$ (m>0) or the like in order to confer the property of efficiently transmitting light upon the anode electrode 213 and in order to facilitate the injection of holes into the hole transporting layer of the organic electroluminescent layer 212.

The reflector 214 is made of a conductive metal, such as Al, which exhibits the property of reflecting visible light, and efficiently directs to the light waveguides 231 the light emitted from the organic electroluminescent layer 212 in the optical address section Ad. The reflector 214 compensates for the conductivity of the anode electrode 213 whose sheet resistance is relatively high.

A plurality of data electrodes 215 are formed parallel with each other on that part of the substrate 210 which is located in the display section Dp, and extend in the column direction perpendicular to the row direction. Each data electrode 215 is made of a metal whose sheet resistance is low, such as Al, Cr, Ag or the like, and which is opaque with respect to visible light. Each data electrode 215 is connected to the emitters of the phototransistors 216 in the corresponding column. Furthermore, each the data electrode 215 has light-incident apertures 215a through which the light guided by the light waveguides 231 enters the bases of the corresponding phototransistors 216 in the pixels of the organic electroluminescent panel 102. According to the illustration, the light-incident apertures 215a are provided one for each pixel. However, a plurality of light-incident apertures may be provided for each pixel.

The phototransistors 216, included in the pixels P of the organic electroluminescent panel 102 and arranged in columns of n, are located on the data electrodes 215 in the display section Dp. The electroluminescent display elements 202 included in the pixels P are located on the phototransistors 216. The electroluminescent display elements 202 include m×n cathode electrodes 217 arranged in rows of m and columns of n, n organic electroluminescent layers 218 extending parallel with each other in the column direction on the cathode electrodes 217, and n anode electrodes 219 extending parallel with each other in the column direction on the organic electroluminescent layers 218. Each cathode electrode 217 includes a transparent electrode layer 217a and a metal thin film 217b. The cathode electrodes 217 each including the transparent electrode layer 217a and the metal thin films 217b, the organic electroluminescent layers 218 and the anode electrodes 219 can be formed by the step of forming such an electroluminescent layer and electrodes in the optical address section Ad, as will be explained later. Accordingly, the characteristics and structures of the cathode electrodes 217, the organic electroluminescent layers 218 and the anode electrodes 219 are the same as those of such an electroluminescent layer and electrodes in the optical address section Ad. Each cathode electrode 217 is connected to the collector of the corresponding phototransistor 216. Each organic electroluminescent layer 218 may emit one of red light, green light or blue light in units of pixels. In this case, an electroluminescent layer (corresponding to pixels P (1, R) to P (m, R)) which emits red light, an electroluminescent layer (corresponding to pixels P (1, G) to P (m, G)) which emits green light and an electroluminescent layer (corresponding to pixels P (1, B) to P (m, B)) which emits blue light, may be arranged in stripes extending in the column direction.

Each of those parts of the organic electroluminescent layers 218 which correspond to pixels for R has a two-layer structure including an electron transporting layer which faces one of the cathode electrodes 217 and a hole transporting luminescent layer which faces one of the anode electrodes 219.

The electron transporting layer is made of Alq3.

The hole transporting luminescent layer is made of a mixture of poly(N-vinylcarbazole){PVCz},2,5-bis(1-naphtyl)-oxidiazole{BND} and 4-(dicyanometylene)-2-methyl-6-(p-dimethylaminostyryl)-4H-pyran{DCM1}.

Each of those parts of the organic electroluminescent layers 218 which correspond to pixels for G has the same two-layer structure as that of the organic electroluminescent layer 212.

Each of those parts of the organic electroluminescent layers 218 which correspond to pixels for B has a three-layer structure including an electron transporting layer which faces one of the cathode electrodes 217, a hole transporting layer which faces one of the anode electrodes 219, and a luminescent layer formed between the electron transporting layer and the hole transporting layer.

This electron transporting layer is made of Alq3.

The above-mentioned luminescent layer contains 96% 4,4'-bis(2,2-diphenylvinylene)biphenly (hereinafter referred to as DPVBi) by weight and 4% 4,4'-bis((2-carbazole)vinylene)biphenyl by weight.

The aforementioned electron transporting layer is made of α-NPD.

Figure 9:
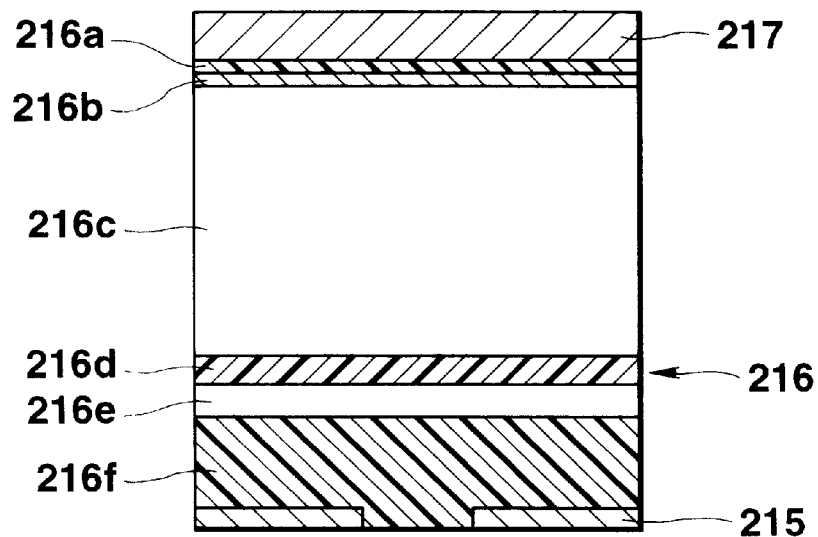
FIG. 9 is a diagram showing a cross section of one of the phototransistors used in the organic electroluminescent panel.

As seen from FIG. 9, the phototransistor 216 are NPN-type bipolar transistors each of which includes, in the order from top to bottom, an N-type silicon layer 216a having a high impurity concentration, an N-type silicon layer 216b having a low impurity concentration, an intrinsic silicon layer 216c, a P-type silicon layer 216d having a high impurity concentration, an intrinsic silicon layer 216e and an N-type silicon layer 216f having a high impurity concentration and formed by plasma CVD.

The above-mentioned silicon layers 216a to 216f are made of amorphous silicon or polysilicon.

The N-type silicon layers 216a of the phototransistors 216 serve as collectors and have a thickness of 5 nm. The N-type silicon layers 216b of the phototransistors 216 are semiconductor layers which have a thickness of 5 nm and in which an impurity has been doped with a concentration lower than the impurity concentration of the N-type silicon layers 216a. The intrinsic silicon layers 216c of the phototransistors 216 have a thickness between 200 nm and 700 nm. The P-type silicon layers 216d of the phototransistors 216 serve as bases and have a thickness of 200 nm. The intrinsic silicon layers 216e of the phototransistors 216 have a thickness of 20 nm. The N-type silicon layers 216f of the phototransistors 216 serve as emitters and have a thickness of 70 nm.

The P-type silicon layers 216d may contain pigment which would facilitate the absorption of light in such a wavelength range as can cause carriers.

When the P-type silicon layers 216d, which serve as the bases of the phototransistors 216, are illuminated with excitation light in a wavelength range including wavelengths of visible light while a predetermined voltage is being applied between each collector and the corresponding emitter, carriers occur in the P-type silicon layers 216d such that an energy gap is removed, the resistance between each collector and the corresponding emitter becomes low and a current flows therebetween. Due to this, a predetermined potential difference occurs between each anode electrode 219 and the corresponding cathode electrodes 217, and a current flows also into the organic electroluminescent layers 18 such that the organic electroluminescent layers 218 of the electroluminescent display elements 202 emit light. While the bases are being illuminated with no excitation light, an energy gap is present in the bases, and the resistance between each collector and the corresponding emitter is accordingly high. In this case, there is substantially no potential difference between each anode electrode 219 and the corresponding cathode electrodes 217, under which condition no current flows into the organic electroluminescent layers 218 and consequently they emit no light. The phototransistors 216 have such a static characteristic as that shown in FIG. 10, and are designed so that the density De of an emitter current Ie becomes saturated when a collector-emitter voltage Vce exceeds a predetermined value. The density De of the emitter current Ie varies according to the luminance per unit area (mW/cm$^2$) of the excitation light with which the bases are illuminated.

The organic electroluminescent layers 218 are thicker than the data electrodes 215. The sum of the thickness of the organic electroluminescent layers 218 and that of the anode electrodes 219 is greater than the sum of the thickness of the data electrodes 215 and that of the phototransistors 216. Because of this, no short-circuiting will occur between any electrodes if the masking of the display section Dp and photolithography are not carried out in the case where the method to be explained later is adopted to form the organic electroluminescent layers 218 and the anode electrodes 219.

The cathode electrodes 211 and anode electrode 213 of the electroluminescent address elements 201 and the reflector 214 in the optical address section Ad, as well as the data electrodes 215 and the anodes 219 of the electroluminescent display elements 202 in the display section Dp, are sealed by a seal member 229 which is made of transparent resin, except for their respective output terminals. A light shielding film 230 is provided on the seal member 229 in order to prevent those components of external light, which are in the same wavelength range as that of the excitation light, from exciting the bases so as to cause a current to flow between each collector and the corresponding emitter. The light shielding film 230 does not admit the entrance of the light components in the same wavelength range as that of the excitation light, but transmits display light, whose luminance is higher than that of the external light and which contains the excitation light components emitted from the electroluminescent display elements 202, to such a degree that the display light can be recognized by eyes.

Figure 11:
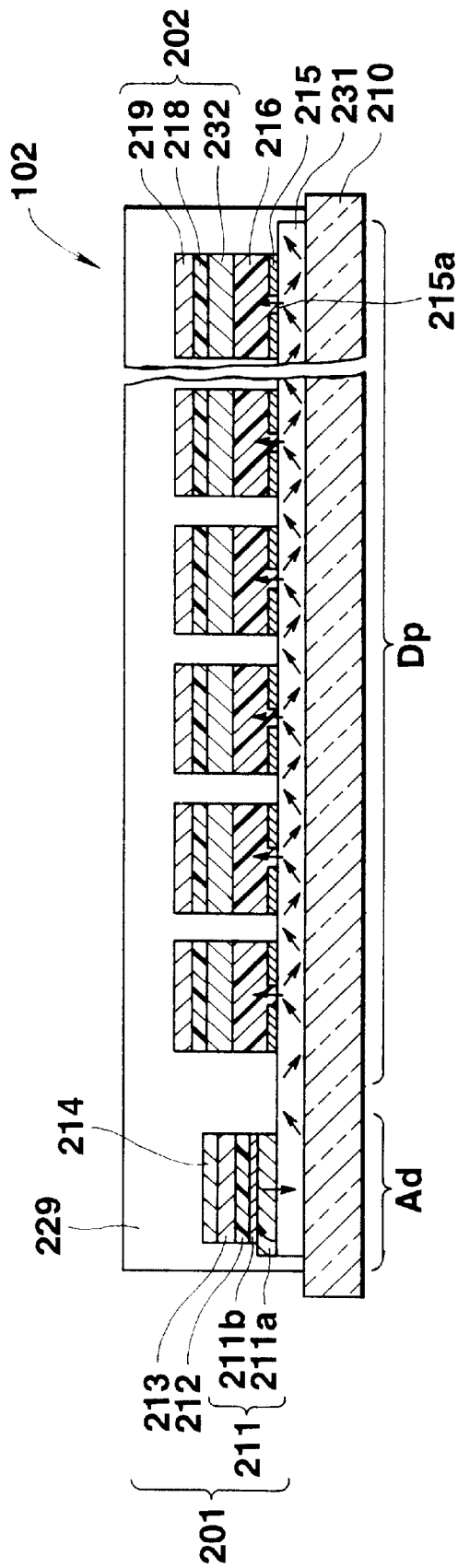
FIG. 11 is a diagram showing a cross section of the organic electroluminescent panel when opaque cathodes are employed as organic electroluminescent display elements.

The light shielding film 230 is not necessary when the material of cathode electrodes 232 of the electroluminescent display elements 202 illustrated in FIG. 11 is selected from conductive materials, such as Al and Mg, which are opaque with respect to light in the range of wavelengths of the excitation light emitted from the electroluminescent address elements 201, and when the cathode electrodes 232 are formed having such a thickness as would permit the cathode electrodes 232 to satisfactorily shield the external light. A plurality of light waveguides, which are made of a material having a refractive index higher than that of the substrate 210, may be formed as the light waveguides 231 on the substrate 210.

In the pixels P of the organic luminescent panel 102, the data electrodes 215 apply an image data voltage E2(V) having a negative potential to the emitters of the phototransistors 216, and the excitation light emitted from the electroluminescent address elements 201 enters the bases of the phototransistors 216 such that the current Ie flows between each collector and the corresponding emitter, thus making the electroluminescent display elements 202 emit light.

The operation of the digital still camera according to this embodiment will now be described.

In the case where the mode of the digital still camera has been set at the photographing mode (the monitoring mode and the image recording mode) by operating the mode setting key 12a, the electric signal Se corresponding to the electric charges, accumulated in the picture elements of the CCD 21 in accordance with the image formed by the lens, is sequentially input to the sample-and-hold circuit 22 in accordance with the drive signal supplied from the vertical driver 24. The sample-and-hold circuit 24 outputs the effective part of the electric signal Se to the A/D converter 23 as the analog electric signal Se'. The readout photographed image signal Se is supplied to the A/D converter 23 through the sample-and-hold circuit 224. The A/D converter 23 converts the image signal Se to the digital image data Sd, and supplies the digital image data Sd to the color process circuit 26.

The color process circuit 26 outputs YUV data as luminance/chrominance digital data to the DMA controller 27 in accordance with the digital image data Sd. The DMA controller 27 records/updates the YUV data in the DRAM 28. The CPU 31 reads out, from the DRAM 28, 1-frame YUV data transferred from the DMA controller 27, and makes the VRAM controller 33 write the 1-frame YUV data in the VRAM 34. The digital video encoder 35 reads out the 1-frame YUV data every predetermined cycle from the VRAM 34 via the VRAM controller 33 in linear sequence, generates the analog video signal Sa and outputs the analog video signal Sa to the display section 10. The display section 10 displays the image corresponding to the analog video signal Sa. When the shutter key 12b is depressed at that point, the CPU 31 controls the timing generator 25 and the color process circuit 26 so as to stop the transferring operation as instructed by the CPU 31. The electric signal Se, which corresponds to the 1-frame image transferred latest, is converted to YUV data via the sample-and-hold circuit 22, the A/D converter 23 and the color process circuit 26. The DMA controller 27 reads out the YUV data in a predetermined format, and inputs it to the image compression/decompression circuit 32. The image compression/decompression circuit 32 compresses the YUV data. The compressed data is stored in the recording memory 30.

In the case where the mode of the digital still camera has been set at the playback mode by operating the mode setting key 12a, the CPU 31 reads out the compressed image data, selected by depressing the "+" key 12c or the "−" key, from the recording memory 30. The image compression/decompression circuit 32 decompresses the readout image data. The decompressed data is written in the VRAM 34 under the control of the VRAM controller 33. The video encoder 35 reads out the written YUV data, converts it to the analog video signal Sa, and outputs the analog video signal Sa to the display section 10.

The analog video signal Sa is input to the chroma circuit 111. The chroma circuit 111 separates the analog video signal Sa into gamma-controlled analog RGB signals $S_{R1}$, $S_{G1}$, $S_{B1}$, a vertical sync signal VD and a horizontal sync signal HD. The phase comparator 112 determines a horizontal timing on the basis of the horizontal sync signal HD supplied from the chroma circuit 111 and the phase comparison signal CKH supplied from the EL controller 101, and outputs signals to the EL controller 101. In accordance with those signals, the EL controller 101 outputs the control signal group DCNT and the control signal group GCNT to the data driver 104 and the selection driver 103, respectively. The analog RGB signals $S_{R2}$, $S_{G2}$ and $S_{B2}$, output from the level shifter 113 after being adjusted appropriately, are input to the data driver 101 in accordance with the control signal group DCNT.

The control signal group GCNT, generated by the EL controller 101 and including the start signal IN, the signals Φ1, Φ2, the clock signal CK1 and the inverted clock signal¬CK1, is supplied to the selection driver 103.

The selection driver 103, when supplied with the start signal IN of the control signal group GCNT generated by the EL Controller 101, starts operating.

During the period of scan (1 horizontal period) performed by the selection driver 103, the data driver 104 operates as follows in accordance with the control signal group DCNT generated by the EL controller 101:

The EL controller 101 sequentially supplies the clock signal CLK to the data driver 104. At that time, the sampling signal is transferred to each stage in response to the start signal IND output per gate line GL1. The level shifter 104 converts the transferred sampling signal to one in the operation level and outputs it in sequence. The analog video signals $S_{R2}$, $S_{G2}$ and $S_{B2}$ are input to the multiplexer 104d in parallel. Based on the arrangement signal AR of the control signal group DCNT, the multiplexer 104d arranges the input analog video signals in order according to the arrangement of RGB to be represented by pixels in each line, and supplies those analog video signals to the sample-and-hold buffer 104c. The sample-and-hold buffer 104c sequentially samples the analog video signals $S_{R2}$, $S_{G2}$ and $S_{B2}$ in accordance with the sampling signal supplied from the level shifter 104b, and outputs them in parallel via the internal buffers to the drain lines DL1 to DLm.

Figure 12:
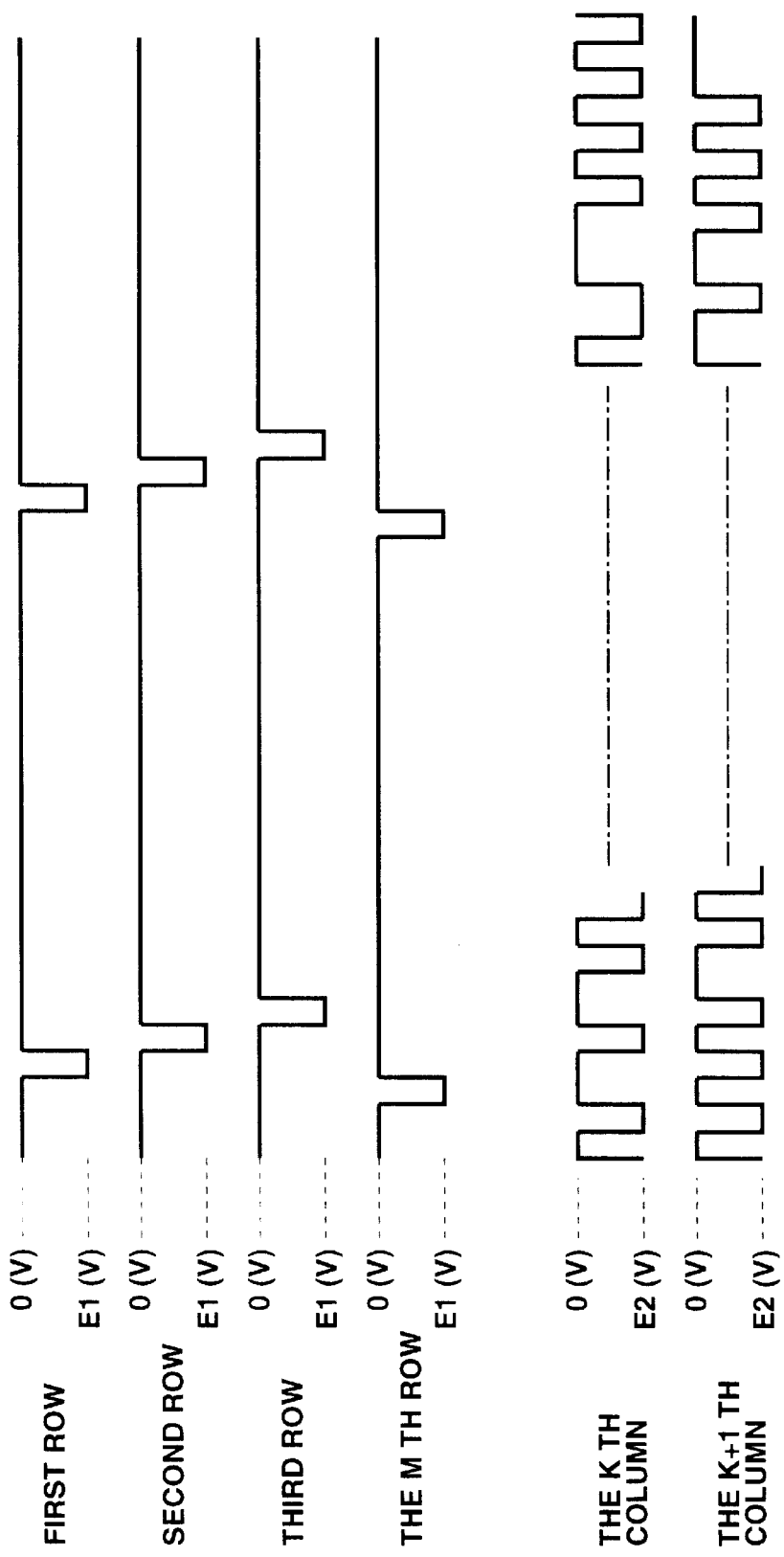
FIG. 12 is a chart showing the waveforms of voltages for driving the organic electroluminescent panel.

As shown in FIG. 12, the selection driver 103 applies a voltage E1 (V) having a negative potential sequentially to the cathodes of the electroluminescent address elements 201. The electroluminescent address elements 201 emit light substantially only while the voltage E1 (V) is being applied. The light emitted from the electroluminescent address element 201 in the first row enters the bases of the phototransistors 216 of the pixels P (1,1) to P (1, n) in the first row through the corresponding light waveguide 231. The phototransistors 216 in the first row are switched on, and the image data voltage E2 (V) or 0 (V) from the data driver 104 is applied to the emitters. The electroluminescent display elements 202 included in those of the pixels P to which the voltage E2 (V) has been applied emit light.

Thus, the voltage E1 (V) is applied to the cathodes of the electroluminescent elements 201 in the sequence of the first to m-th rows, and the image data voltage from the data driver 104 is applied to the emitters of the phototransistors 216 accordingly.

The emission of light, which the electroluminescent display elements 202 in the display section Dp performs when they are driven in the above-described manner, will now be explained with reference to FIGS. 13A and 13B.

Of all electroluminescent display elements 202, only those corresponding to two rows and two columns will be referred to in the following explanation concerning the emission of light. In FIGS. 13A and 13B, the upper one of the two rows is shown as the J-th row, while the lower one is shown as the "J+1-th row. The left-hand one of the two columns is shown as the K-th column, while the right-hand one is shown as the K+1th column ("J" and "K" are arbitrary integers).

Figure 13A:
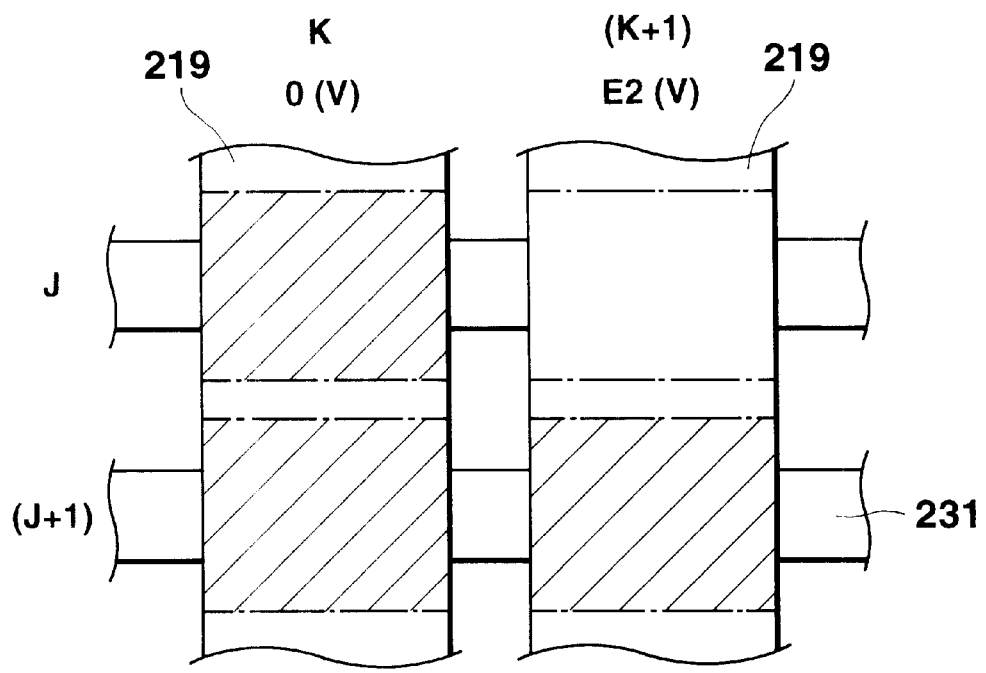
FIG. 13A is a diagram showing electroluminescent display elements in plan view when the electroluminescent address element of the J-th row is selected.

In the period during which the J-th row is selected, light is guided by the light waveguide 231 of the J-th row as shown in FIG. 13A, and enters the bases of the phototransistors 216 of the pixels P (J, K) and P (J, K+1) such that the resistance of those phototransistors 216 becomes low. Meanwhile, no light enters the bases of the phototransistors 216 of the pixels P (J+1, K) and P (J+1, K+1), and accordingly the resistance of those phototransistors 216 remains high.

Then, the data driver 104 applies the voltages 0 (V) and E2 (V) to the data electrode 215 of the K-th column and the data electrode 215 of the K+1-th column, respectively. Since the anode electrodes 219 of the electroluminescent display elements 202 are connected to the ground, the voltage between each data electrode 215 and the corresponding anode electrode 219 is 0 (V) in the pixel P (J, K), E2 (V) in the pixel P (J, K+1), 0 (V) in the pixel P (J+1, K), and E2 (V) in the pixel P (J+1, K+1).

When the voltage between each data electrode 215 and the corresponding anode electrode 219 is as described above, the electroluminescent display elements 202 of the pixels P (J, K) and P (J+1, K) emit no light, because the aforementioned voltage is 0 (V). Since the resistance of the phototransistor 216 of the pixel P (J, K+1) is low, a voltage nearly equal to E2 is applied between the cathode electrode 217 and anode electrode 219 of the electroluminescent display element 202 of the pixel (J, K+1) such that the electroluminescent display element 202 of the pixel (J, K+1) emits light. On the other hand, the resistance of the phototransistor 216 of the pixel P (J+1, K+1) is high, under which condition the voltage E2 (V) is not applied between the cathode electrode 217 and anode electrode 219 of the electroluminescent display element 202 of the pixel P (J+1, K+1), and a voltage nearly equal to 0 (V) or lower than the threshold value of the electroluminescent display element 202 is applied between the above electrodes. Due to an unintended voltage being thus applied therebetween, the electroluminescent display element 202 of the pixel P (J+1, K+1) emits no light. In short, no crosstalk occurs.

Figure 13B:
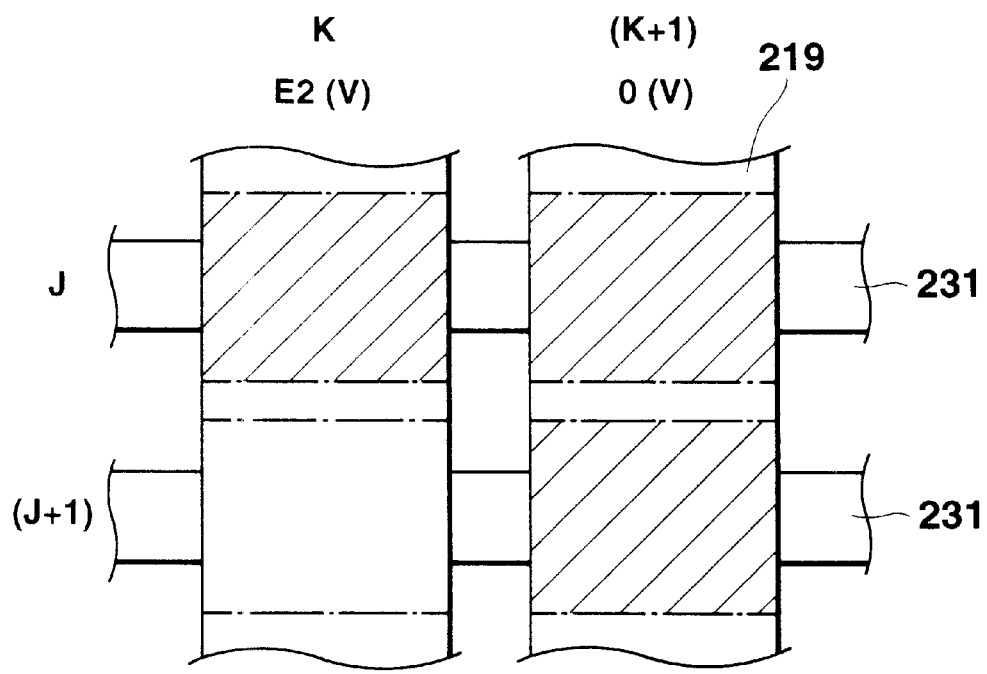
FIG. 13B is a diagram showing the electroluminescent display elements in plan view when the electroluminescent address elements of the J+1-th row is selected.

In the period during which the J+1-th row is selected, light is guided by the light waveguide 231 of the J+1-th column as shown in FIG. 13B, and enters the bases of the phototransistors 216 of the pixels P (J+1, K) and P (J+1, K+1) such that the resistance of those phototransistors 216 becomes low. Meanwhile, no light enters the phototransistors 216 of the pixels P (J, K) and P (J, K+1) in the J-th row, and accordingly the resistance of those phototransistors 216 becomes high again.

In that case, the electroluminescent display element 202 of the pixel P (J, K+1), which is emitting light in the period of selection of the J-th row, stops emitting light, because the resistance of the phototransistor 216 of the pixel P (J, K+1) has become high. The electroluminescent display element 202 of the pixel P (J, K) emits no light as well, since the resistance of the phototransistor 216 of the pixel P (J, K) is high. On the other hand, the electroluminescent display element 202 of the pixel P (J+1, K), whose phototransistor 216 has become low in resistance, emits light due to the voltage between the electrodes being nearly equal to E2 (V). The resistance of the phototransistor 216 of the pixel P (J+1, K+1) is low. However, since the voltage applied by the corresponding data electrode 215 is 0 (V), the electroluminescent element 202 of the pixel P (J+1, K+1) emits no light.

As explained above, according to the organic electroluminescent display device of this embodiment, the electroluminescent address element 201 currently selected by the selection driver 103 emits light. The emitted light is guided by the corresponding light waveguide 231 and enters the bases of the corresponding phototransistors 216 through the light-incident apertures 215a such that carriers occur in the bases. When the data driver 104 applies the image data voltage E2 (V) having a negative potential to the data electrodes 215, a forward bias voltage is applied to the above phototransistors 216, and collector-emitter currents flow as a result. The electroluminescent display elements 202 connected to the above phototransistors 216 emit light when the currents flow into them.

Meanwhile, the electroluminescent address elements 201 which are not being selected by the selection driver 103 emit no light. In the corresponding phototransistors 216, therefore, the resistance between the collector and the emitter remains high. Due to this, no voltage is applied to the corresponding electroluminescent display elements 202 even though the data driver 104 applies the image data voltage E2 (V) to the data electrodes 215. Therefore, the organic electroluminescent display device of this embodiment can display a high-quality image without the crosstalk occurring.

Furthermore, the image data voltage E2 (V) having a negative potential, applied by the data driver 104, drives the phototransistors 216 in the range wherein the current saturation occurs. Therefore, even if the phototransistors 216 have different static characteristics, this will not result in different currents flowing into the electroluminescent display elements 202, and the electroluminescent display elements 202 will emit light at substantially the same luminance, ensuring uniform brightness over the entirety of the organic electroluminescent display panel 102.

In the case where an electroluminescent layer (corresponding to the pixels P (1, R) to P (m, R)) which emits red light, an electroluminescent layer (corresponding to the pixels P (1, G) to P (m, G)) which emits green light and an electroluminescent layer (corresponding to the pixels P (1, B) to P (m, B)) which emits blue light, are arranged in stripes extending in the column direction as the organic electroluminescent layers 218, and in the case where those layers differ in luminance-voltage characteristic from each other, the voltage E2 (V) may be set at the optimum value depending on the colors of the light emitted by them.

Moreover, in the organic electroluminescent panel 102 of the present invention, the electroluminescent display elements 202, which are in one-to-one correspondence with the pixels, are stacked on their corresponding phototransistors 216. In this case, there is no need to form the active elements around the electroluminescent display elements 202 of the pixels. This ensures a large aperture ratio to the pixels of the organic electroluminescent panel 102 used in the organic electroluminescent display device of this embodiment.

Figure 10:
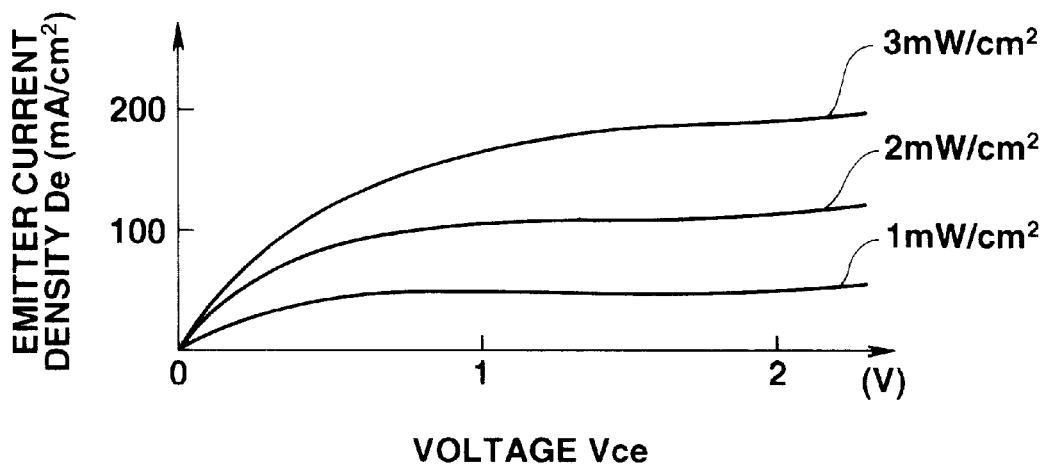
FIG. 10 is a diagram showing the static characteristic of the phototransistors used in the organic electroluminescent panel.
Figure 14:
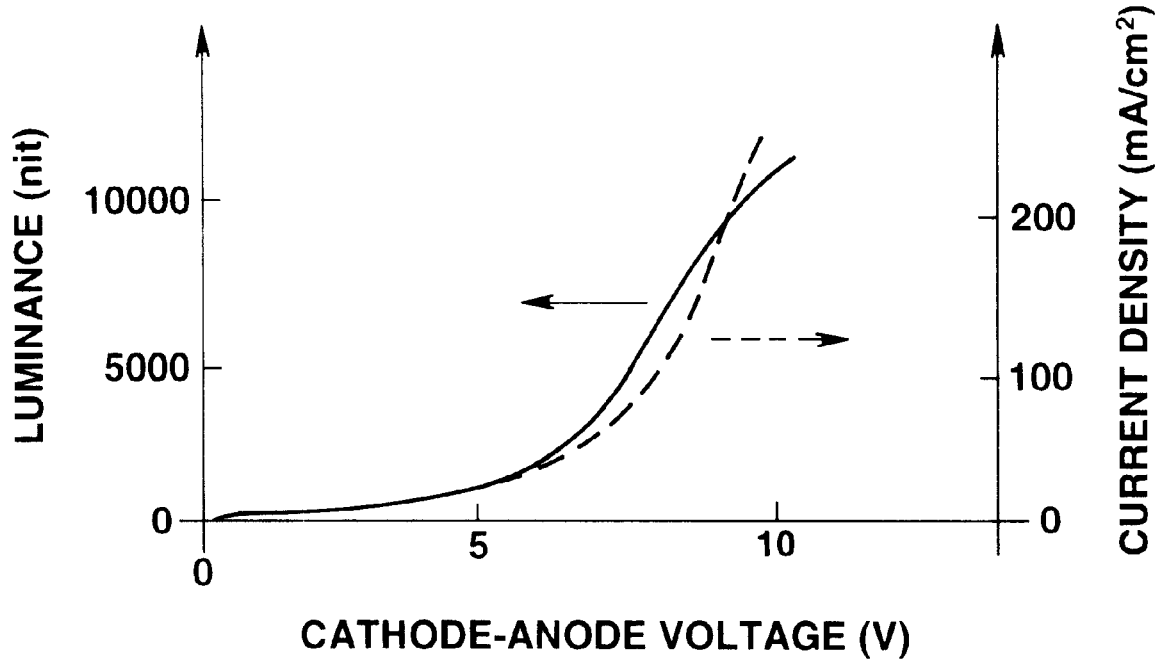
FIG. 14 is a diagram showing the luminance characteristic of the electroluminescent display elements.

Furthermore, according to the organic electroluminescent panel 102 of the present invention, one frame period is divided into a plurality of sub frame periods, and the luminances attained in the sub frame periods are added together in order to perform a gradation control. The selection voltage E1 for sequentially scanning the electroluminescent address elements 201 of the first to m-th rows during the first sub frame period is determined so that the power per unit area of the electroluminescent address elements 201 is 1 (mW/cm$^2$) as shown in FIG. 10. Using the selection voltage E1 thus determined, the electroluminescent address elements 201 of the first to m-th rows are sequentially scanned during the first sub frame period. In the second sub frame period, the electroluminescent address elements 201 of the first to m-th rows are sequentially scanned using the selection voltage E1 determined so that the power per unit area of the electroluminescent address elements 201 is 2 (mW/cm$^2$) which is two times as high as the density De of the emitter current Ie in the case of the first sub frame period. In the third sub frame period, the electroluminescent address elements 201 of the first to m-th rows are sequentially scanned using the selection voltage E1 determined so that the power per unit area of the electroluminescent address elements 201 is 4 (mW/cm$^2$) which is four times as high as the density De of the emitter current Ie in the case of the first sub frame period. Thus, the density De of the emitter current Ie for the L-th sub frame period is determined so as to be $2^{L-1}$ times as high as that in the case of the first sub frame period. The density De of the emitter current Ie is proportional to the density Dp of the currents flowing into the organic electroluminescent layers 218. Furthermore, as shown in FIG. 14, the luminance of the organic electroluminescent layers 218 is almost directly proportional to the current density Dp. That is, the selection voltage E1 is determined so as to control the density De of the emitter current Ie of the phototransistors 216, and an image is displayed at the gradation luminance corresponding to the sum of the luminances attained in the respective sub frame periods. In this case, the data voltage E2 may be constant.

According to another gradation controlling drive method, the data voltage E2 to be applied to scan the electroluminescent address elements 201 of the first to m-th rows during the L+1-th sub frame period is determined so as to be two times as high as that applied to scan the electroluminescent address elements 201 of the first to m-th rows during the L-th sub frame period. In this case, the selection voltage E1 is constant.

An example of a process for manufacturing the organic electroluminescent panel 102 will now be described with reference to FIGS. 15A to 15H.

First, thin coating films made of Pb are formed on those parts of a surface of a transparent quarts glass substrate in which the light waveguides 231 are to be formed, after which the glass substrate is placed in a high-temperature atmosphere such that the Pb atoms diffuse into the glass substrate. The substrate 210 in which the light waveguides 231 have been formed is prepared in this manner (this step is not illustrated).

Next, Al or the like for forming the data electrodes 215 is deposited by a vacuum deposition method on the substrate 210 including the light waveguides 231. The redundant parts of thus formed Al layer or the like which are not used as the data electrodes 215 are exposed to light. The redundant parts as exposed to light are removed by using an etchant for liquefying them. Alternatively, in the state wherein the substrate 210 is covered with a predetermined metal mask, patterns are formed on the substrate 210 by the vapor deposition of Ag or the like. The data electrodes 215 are thus formed (FIG. 15A).

Following the above, a metal mask is formed on that portion of the substrate 210 which is used as the optical address section Ad, and an NPN semiconductor layer 221 for the phototransistors 216 is formed by a plasma CVD deposition method on the other portion covered with no metal mask and which is used as the display section Dp (FIG. 15B).

After the above, conductive layers 222 for the transparent electrode layers 211a and 217a are formed on the portion which is used as the optical address section Ad, as well as on the NPN semiconductor layer 221 formed on the portion which is used as the display section Dp (FIG. 15C).

Next, metal thin films 223 for the metal thin films 211b and 217 are formed by vapor deposition of Mg, Mg alloy or the like on the conductive layers 222, provided on the portion which is used as the optical address section Ad and on the NPN semiconductor layer 221 formed on the portion which is used as the display section Dp (FIG. 15D).

Then, the redundant parts of the optical address section Ad which are not used as the electroluminescent address elements 201, as well as the redundant parts of the display section Dp which are not be used as the phototransistors 216 or the electroluminescent display elements 202, are exposed to light. The redundant parts as exposed to light, i.e., the redundant parts of the NPN semiconductor layer 221, the redundant parts of the conductive layers 222 and the redundant parts of the metal thin films 223, are removed by using an etchant for liquefying them. By the above-described steps, the transparent electrode layers 211a and the metal thin films 211b in the optical address section Ad are formed, as well as the phototransistors 216, the transparent electrode layers 217a and the metal thin films 217b in the display section Dp (FIG. 15E).

Next, employing a metal mask which has openings in the positions in which the optical address section Ad and the pixels for G of the display section Dp are to be provided, Bebq2 for forming the organic electroluminescent layer 212 and the electron transporting luminescent layers of those parts of the organic electroluminescent layers 218 which correspond to the pixels for G is deposited in the openings. Then, employing a metal mask which has openings in the positions in which the pixels for R and B of the display section Dp are to be provided, Alq3 for orming the electron transporting layers of those parts of the organic electroluminescent layers 218 which correspond to the pixels for R and B is deposited in the openings. Then, employing a metal mask which has openings in the positions in which the pixels for B of the display section Dp are to be provided, DPVBi (96wt %) and BCzVBi (4wt %), both for forming the luminescent layers of those parts of the organic electroluminescent layers 218 which correspond to the pixels for B, are deposited in the openings. Employing a metal mask which has openings in the positions in which the pixels for R are to be provided, the mixture of poly(N-vinylcarbazole) {PVCz},2,5-bis(1-naphtyl)-oxidiazole{BND} and 4-(dicyanometylene)-2-methyl-6-(p-dimethylaminostyryl)-4H-pyran{DCM1} is deposited in the openings. Moreover, employing a metal mask which has openings in the positions in which the optical address section Ad and the pixels for G and B of the display section Dp are to be provided, α-NPD for forming the organic electroluminescent layer 212 and the hole transporting layers of those parts of the organic electroluminescent layers 218 which correspond to the pixels for G and B is deposited in the openings. Unless the metal masks are positioned accurately, an unintended organic electroluminescent layer is formed in a non-emission area between the phototransistors 216 of the pixels. However, the organic electroluminescent layers 218 are thicker than the data electrodes 215, and the sum of the thickness of the organic electroluminescent layers 218 and that of the anode electrodes 219 is smaller than the sum of the thickness of the data electrodes 215 and that of the phototransistors 216, as mentioned previously. Therefore, the occurrence of short-circuiting between adjacent data electrodes 215 can be prevented by forming the anode electrodes 219 by the next step (FIG. 15F).

Next, ITO or the material for forming the anode electrodes 213 and 219 is sputtered using a metal mask which separates the optical address section Ad and the display section Dp from each other, whereby the anode electrodes 213 and 219 are formed. At that time, an unintended conductive layer is formed in an area between the phototransistors 216 of the pixels. However, since the thickness of the anode electrodes 219 has been determined as above, short-circuiting does not occur between adjacent cathode electrodes 217. By the above-described steps, the electroluminescent address elements 201 and electroluminescent display element 202 are formed (FIG. 15G).

The reflector 214 is formed on the anode electrode 213 of the electroluminescent address elements 201 in the optical address section Ad (FIG. 15H).

The parts constituting the organic elctroluminescent panel 102 are sealed by the seal member 229 which is made of transparent resin (this step is not illustrated). Furthermore, the light shielding film 230 is provided on the seal member, thus finishing the organic electroluminescent panel 102 (this step is not illustrated as well).

According to the method for manufacturing the organic electroluminescent panel 102 of this embodiment, the electroluminescent display elements 201 for optical addressing and the electroluminescent display elements 202 for displaying an image can be formed by the same step. Accordingly, the number of manufacturing steps is smaller than in the case where the electroluminescent address elements 201 and the electroluminescent display elements 202 are formed by different steps, with the result that the manufacturing cost of the organic electroluminescent panel 102 is reduced. Moreover, the formation of the organic electroluminescent layers 218 does not involve fine processing. Therefore, the manufacturing cost of the organic electroluminescent panel 102 is further reduced.

According to the above embodiment, the light waveguides 231 are formed by diffusing an impurity like Pb or the like into the glass material constituting the substrate 210 so that the light waveguides 231 have a refractive index different from that of the substrate 210. However, the light waveguides 231 can be formed employing other methods such as the method of stacking, on the substrate 210, a glass material whose refractive index differs from that of the substrate 201. For example, light waveguides which are made of an alloy of In and Zn oxides may be formed on the substrate 210 in integration with the transparent electrode layers 211a. In this case, at the stage of forming the light waveguides, the amount of oxygen supplied as a material for forming the light waveguides is increased so that the light waveguides have an insulation property. At the subsequent stage of forming the transparent electrode layers 211a, the amount of oxygen as supplied is decreased so that the transparent electrode layers 211a are made of an alloy of oxides which exhibit a conductive property. After the transparent electrode layers 211a are patterned, the light waveguides 231 are patterned.

It is preferred that the refractive index n1 of the substrate 210 and the refractive index n2 of the light waveguides 231 satisfy a relation of n2>n1 in order to permit address light to reflect as many times as possible at the interface between the substrate 210 and the light waveguides 231, that is, in order to make the critical angle of total reflection small. In short, it is preferred that the material of the substrate 210 and that of the light waveguides 231 be selected so as to satisfy the above relation. Furthermore, it is preferred that the refractive index n2 of the light waveguides 231 and the refractive index n3 of the transparent electrode layers 211a satisfy the relation of n2≒n3 or n2≧n3, in order to suppress the reflection of address light at the interface between each transparent electrode layer 211a and the corresponding light waveguide 231 when the address light emitted from each transparent electrode layer 211a enters the corresponding light waveguide 231. If the light waveguides 231 and the transparent electrodes 211a are formed of substantially the same material, they will have substantially the same refractive index. Moreover, it is preferred that the refractive index n2 of the light waveguides 231 and the refractive index n4 of those elements of the phototransistors 216 which are in contact with the waveguides 231 satisfy a relation of n2≒n4 or n2≦n4.

In the above-described embodiment, the light shielding film 230 prevents external light from entering the phototransistors 216. However, the metal thin films 217b in the display section Dp may be formed thicker than the metal thin films 211b in the optical address section Ad, or alternatively, the metal thin films 217b may be formed of a light shielding conductive material different from that forming the metal thin films 211b which have the property of transmitting light. In this case, the metal film films 217b prevents the light, emitted from the electroluminescent address elements 201, from entering the electroluminescent display elements 202, as well as prevents the light, emitted from one electroluminescent display element 202, from being undesirably guided by the corresponding light waveguide 231 to another electroluminescent display element 202 so as to cause a carrier in the base of the corresponding phototransistor 216.

In the above-described embodiment, the electroluminescent display elements 202 are stacked on their corresponding phototransistors 216. However, the electroluminescent display elements 202 may not be stacked thereon. For example, the structure wherein the phototransistors are formed around the organic electroluminescent elements constituting the respective pixels can be employed. In this case also, a high-quality image ca be displayed without the crosstalk occurring, although the aperture ratio of the pixels is smaller than that of the organic electroluminescent panel 102 of the above-described embodiment.

According to the above embodiment, the phototransistors 216 are NPN type. Furthermore, the electroluminescent display elements 202 include the cathode electrodes 217, the organic electroluminescent layers 218 and the anode electrode 219, all being stacked in the described order. Of those electrodes and layers, the cathode electrodes 217 are closest to the substrate 210, while the anode electrode 219 is grounded. In the present invention, however, PNP-type phototransistors can also be adopted, and the order in which the cathode electrodes and the anode electrode are stacked may be reversed.

Figure 16A:
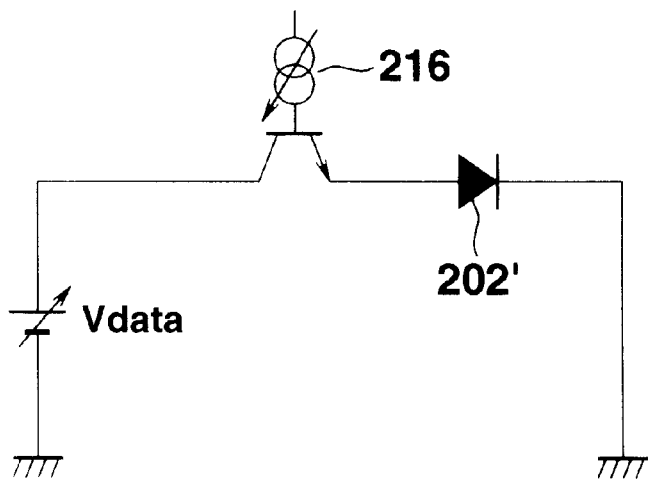
FIGS. 16A to 16C are diagrams each illustrating the equivalent circuit corresponding one pixel of the organic electroluminescent panel.
Figure 16B:
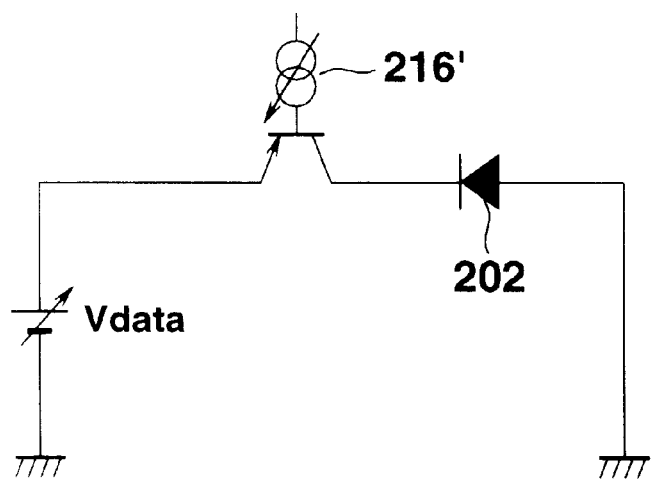
Figure 16C:
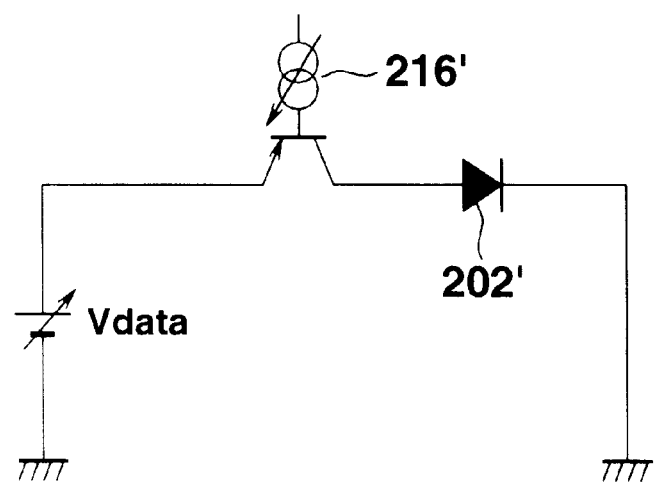
Figure 17:
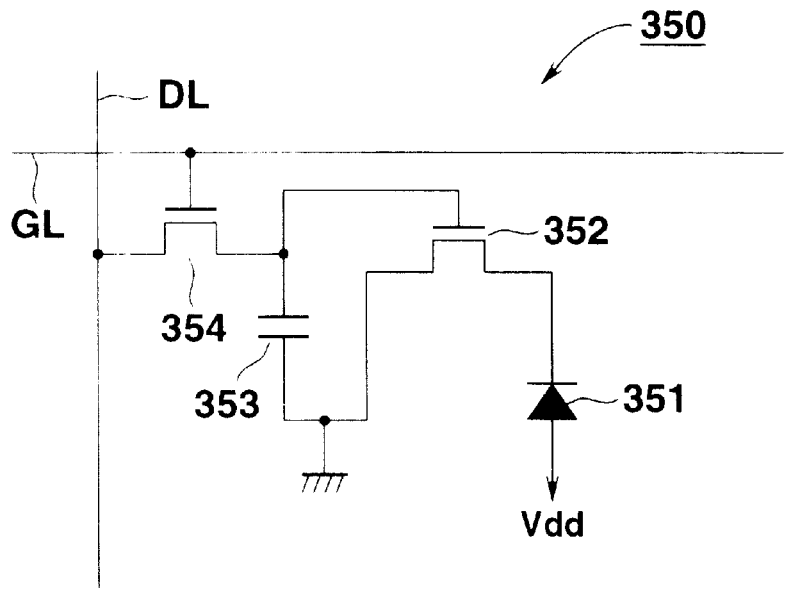
FIG. 17 is a circuit diagram illustrating a conventional electroluminescent display device of the active-matrix drive type.
Figure 18:
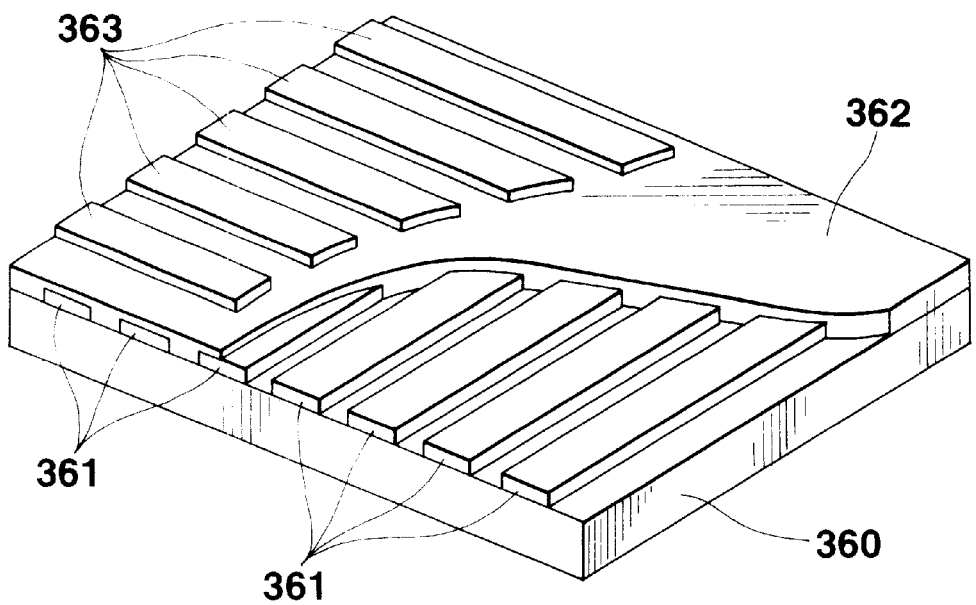
FIG. 18 is a diagram showing an exploded perspective view of a conventional electroluminescent display device of the simple-matrix drive type.

Each of FIGS. 16A to 16C illustrates the equivalent circuit corresponding to one pixel of the organic electroluminescent panel modified as above.

In the organic electroluminescent panel illustrated in FIG. 16A, the equivalent circuit has an NPN-type phototransistor 216 and an electroluminescent display element 202'. The electroluminescent display element 202' has an organic electroluminescent layer which includes a hole transporting layer and an electron transporting luminescent layer (in the case of the pixels for G, for example), both being stacked on one another in the order reverse to that of the above-described case. The electroluminescent element 202' has also an anode electrode and a cathode electrode located above the anode electrode. After the anode electrode is formed by using ITO or the like as a transparent electrode, the organic electroluminescent layer is formed and thereafter the cathode electrode is formed by stacking a metal thin film and a transparent electrode layer on one another in sequence. In this case, the cathode electrode is grounded, and a voltage having a positive potential is applied to the data electrodes 215. The order of arrangement of the layers forming the phototransistor 216 is reverse to that shown in FIG. 9.

In the organic electroluminescent panel illustrated in FIG. 16B, the equivalent circuit has an PNP-type phototransistor 216' and an electroluminescent display element 202. In this case, the anode electrode of the electroluminescent display element 202 is grounded, and a voltage having a positive potential is applied to the data electrodes 215.

In the organic electroluminescent panel illustrated in FIG. 16C, the equivalent circuit has an PNP-type phototransistor 216', whose collector and emitter are arranged in the order reverse to that of the phototransistor 216, and an electroluminescent display element 202'. In this case, the cathode electrode of the electroluminescent display element 202' is grounded, and a voltage having a negative potential is applied to the data electrodes 215.

According to the above-described embodiment, the pixels for red (R), those for green (G) and those for blue (B) are arranged in a predetermined order in the display section Dp. One frame period is divided into a plurality of sub frame periods, and the organic electroluminescent layers 218 of the individual pixels are made to emit light in their respective sub frame periods so that the display section Dp displays a full-color image. In the present invention, however, the organic electroluminescent layers 218 of the individual pixels in the display section Dp may be formed of the same material, and the display section Dp may be designed so as to display a monochrome image in a predetermined color. Alternatively, the material forming the organic electroluminescent layers 218 may differ area by area in the display section Dp, and the display section Dp may be designed so as to display a multicolor image. According to the above-described embodiment, the organic electroluminescent layer 212 in the address section Ad and the organic electroluminescent layers 218 in the display section Dp are formed of the same organic electroluminescent material. However, the organic electroluminescent layer 212 in the address section Ad may not necessarily be formed of the same material as that of the organic electroluminescent layers 218 in the display section Dp. If a predetermined current can flow between the collector and emitter of each phototransistor 216 in the display section Dp, the organic electroluminescent layer 212 can be formed so as to emit ultraviolet light, for example. In this case, each phototransistor 216 is designed so that ultraviolet light causes a carrier in the base and makes a current flow between the collector and the emitter. If the light shielding film 230 is designed to absorb light in the range of wavelengths of ultraviolet light and to transmit light in the range of wavelengths of display light, the luminance of the electroluminescent display elements 202 will be increased.

In the above embodiment, the phototransistor 216 are used as the active elements which absorb the light guided by the light waveguides 231 so that carriers occurs. However, the present invention is also applicable to spontaneous light emission display elements adopting other types of active elements which have the property of absorbing light like that from photodiodes so that carriers occur.

Explained in the above embodiment is the case where the present invention has been applied to the organic electroluminescent display elements which employ the organic electroluminescent layers as luminescent layers. However, the present invention is also applicable to spontaneous light emission display elements which employ other luminescent elements such as inorganic electroluminescent elements.

In the display device explained above, the selection driver 103 sequentially selects the first to m-th rows one by one, without skipping over any row. However, one frame may be divided into two fields, for example, and skipping may be performed within one field.

Explained above is the case where the present invention has been applied to a digital still camera. However, the present invention is also applicable to a video camera which uses a display device as a view finder. The present invention, moreover, may also be applied to the display devices of other portable terminal units.

What is claimed is:

1. A display device comprising:
   a substrate having a surface side;
   first light emission elements which emit light in a predetermined range of wavelengths when a predetermined voltage is applied to said first light emission elements, said first light emission elements being arranged at the surface side of said substrate and each including an anode electrode, an organic electroluminescent layer and a cathode electrode;
   light waveguides, each of which guides the light emitted from a corresponding one of said first light emission elements;
   active elements, each having a first end and a second end and in each of which a carrier occurs upon incidence of the light emitted from a corresponding one of said first light emission elements and guided by a corresponding one of said light waveguides;
   data electrodes to which a voltage is applied in accordance with image data, the first end of each said active elements being connected to a corresponding one of said data electrodes; and
   second light emission elements which emit light in a predetermined wavelength range when currents flow in said second light emission elements, each of said second light emission elements being arranged at the surface side of said substrate and being connected to the second end of a corresponding one of said active elements, and each of said second light emission elements including an anode electrode, an organic electroluminescent layer and a cathode electrode which are formed of respective same materials as the anode electrode, the organic electroluminescent layer and the cathode electrode of each of said first light emission elements.

2. The display device according to claim 1, wherein said active elements are bipolar transistors.

3. The display device according to claim 2, wherein each of said bipolar transistors has a base in which a carrier occurs when the light emitted from the corresponding first light emission element enters said base, an emitter connected to one of the corresponding data electrode and the corresponding second light emission element, and a collector connected to the other of the corresponding data electrode and the corresponding second light emission element.

4. The display device according to claim 1, wherein said active elements are made of amorphous silicon or polysilicon.

5. The display device according to claim 1, wherein said light waveguides, said data electrodes, said active elements and said second light emission elements are stacked on said substrate in order.

6. The display device according to claim 1, wherein said data electrodes are sandwiched between said light waveguides and said active elements, and have apertures which the light, emitted from said first light emission elements and guided by said light waveguides, passes through.

7. The display device according to claim 1, wherein the cathode electrodes of said second light emission elements shield light in a range of wavelengths of excitation light which excites said active elements, and said second light emission elements are stacked on said active elements.

8. A method for driving a display device wherein:
   (i) said display device includes:
      light waveguides which guide incident light,
      electroluminescent address elements formed on said light waveguides and from which address light to be guided by said light waveguides is emitted in a predetermined range of wavelengths in accordance with an applied voltage, each of said electroluminescent address elements including an anode electrode, an organic electroluminescent layer and a cathode electrode,
      data electrodes provided on said light waveguides, and having light transmission parts which said address light passes through, with a voltage being externally applied to said data electrodes in accordance with image data,
      active elements provided on said data electrodes, each of said active elements having a base in which a carrier occurs when the address light emitted from a corresponding one of said electroluminescent address elements enters said base, and
      electroluminescent display elements provided on said active elements, each of said electroluminescent display elements including an anode electrode, an organic electroluminescent layer and a cathode electrode which are formed of respective same materials as the anode electrode, the organic electroluminescent layer and the cathode electrode of each of said electro-luminescent address elements; and
   (ii) said method comprises steps of:
      having said electroluminescent address elements sequentially emit the address light in order to selectively drive said active elements via said light waveguides; and
      making said electroluminescent display elements emit light by applying a voltage between each of said data electrodes and the anode electrodes or cathode electrodes of said electroluminescent display elements through said active elements which the address light guided by said light waveguides has entered.

* * * * *

UNITED STATES PATENT AND TRADEMARK OFFICE
CERTIFICATE OF CORRECTION

PATENT NO.    : 6,215,462 B1
DATED         : April 10, 2001
INVENTOR(S)   : Hiroyasu Yamada et al.

It is certified that error appears in the above-identified patent and that said Letters Patent is hereby corrected as shown below:

<u>Title page,</u>
Insert -- Item [73]  Assignee: Casio Computer Co., Ltd., Tokyo, Japan --.

Signed and Sealed this

Third Day of September, 2002

Attest:

JAMES E. ROGAN
*Attesting Officer*     *Director of the United States Patent and Trademark Office*